(12) United States Patent
Imanaka et al.

(10) Patent No.: US 8,957,499 B2
(45) Date of Patent: Feb. 17, 2015

(54) LAMINATE STACKED CAPACITOR, CIRCUIT SUBSTRATE WITH LAMINATE STACKED CAPACITOR AND SEMICONDUCTOR APPARATUS WITH LAMINATE STACKED CAPACITOR

(75) Inventors: Yoshihiko Imanaka, Kawasaki (JP); Hideyuki Amada, Kawasaki (JP); Fumiaki Kumasaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 768 days.

(21) Appl. No.: 13/228,091

(22) Filed: Sep. 8, 2011

(65) Prior Publication Data
US 2012/0074521 A1   Mar. 29, 2012

(30) Foreign Application Priority Data
Sep. 10, 2010   (JP) ................. 2010-203637

(51) Int. Cl.
| H01L 29/00 | (2006.01) |
| H01G 4/30 | (2006.01) |
| B82Y 30/00 | (2011.01) |
| B82Y 40/00 | (2011.01) |
| H01G 4/232 | (2006.01) |
| H05K 1/16 | (2006.01) |
| H05K 1/02 | (2006.01) |

(52) U.S. Cl.
CPC ............ *H01G 4/308* (2013.01); *B82Y 30/00* (2013.01); *B82Y 40/00* (2013.01); *H01G 4/232* (2013.01); *H05K 1/162* (2013.01); *H05K 1/0231* (2013.01); *H01L 2224/16225* (2013.01); *H01L 2924/15312* (2013.01); *Y10S 438/957* (2013.01)

USPC .... 257/532; 257/528; 257/534; 257/E21.008; 438/957; 349/51

(58) Field of Classification Search
USPC .......... 257/528, 532, 534, E21.008; 438/957; 349/51
See application file for complete search history.

(56) References Cited

U.S. PATENT DOCUMENTS 7,808,799 B2   10/2010   Kawabe et al.
8,003,479 B2   8/2011   Salama et al.

FOREIGN PATENT DOCUMENTS

| JP | 5-347227 A | 12/1993 |
| JP | 2007-318089 A | 12/2007 |
| JP | 2009-524259 A | 6/2009 |

OTHER PUBLICATIONS

Takeuchi, Tomonari et al., "Preparation of BaTiO$_3$/SrTiO$_3$ composite dielectric ceramics with a flat temperature dependence of permittivity"; Aug. 2003, pp. 1809-1815.

*Primary Examiner* — Thanh V Pham
(74) *Attorney, Agent, or Firm* — Kratz, Quintos & Hanson, LLP

(57) ABSTRACT

A method of manufacturing a capacitor includes forming a first ceramic film on a first base made of a metal, forming a second ceramic film on a second base made of a metal, forming a first copper electrode pattern and a first copper via-plug on a surface of one of the first and second ceramic films, the electrode pattern and the via-plug being separate from each other, bonding the first and second ceramic films together with the first electrode pattern and the via-plug therebetween, by applying a pulsed voltage between the first base and the second base while the first base and the second base are pressed so that the first ceramic film and the second ceramic film are pressed on each other, and removing the second base.

8 Claims, 28 Drawing Sheets

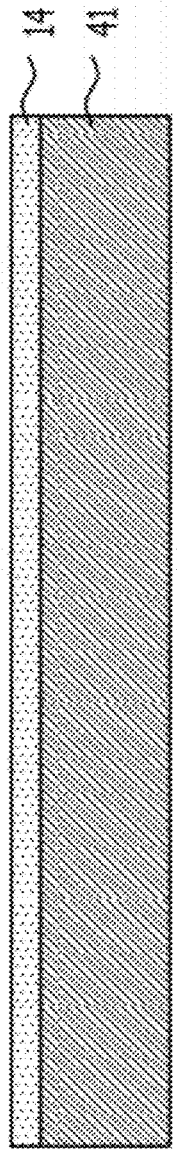
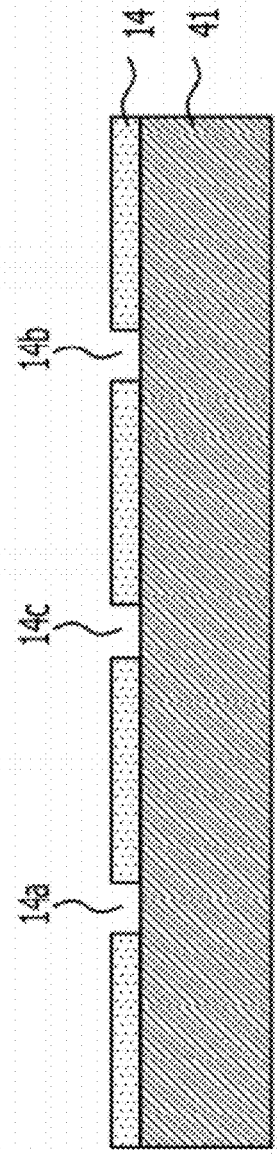
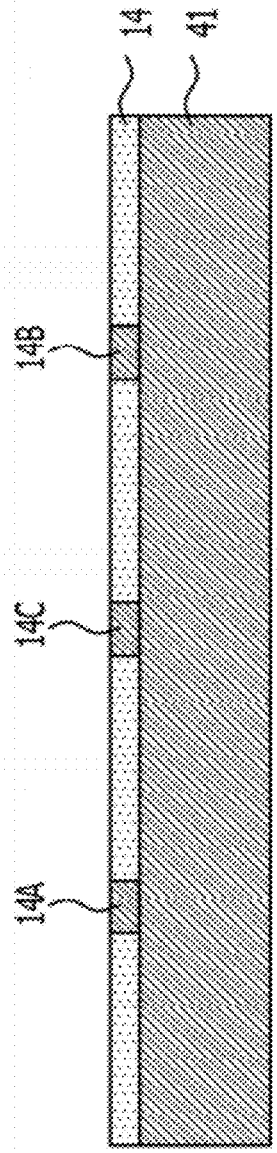

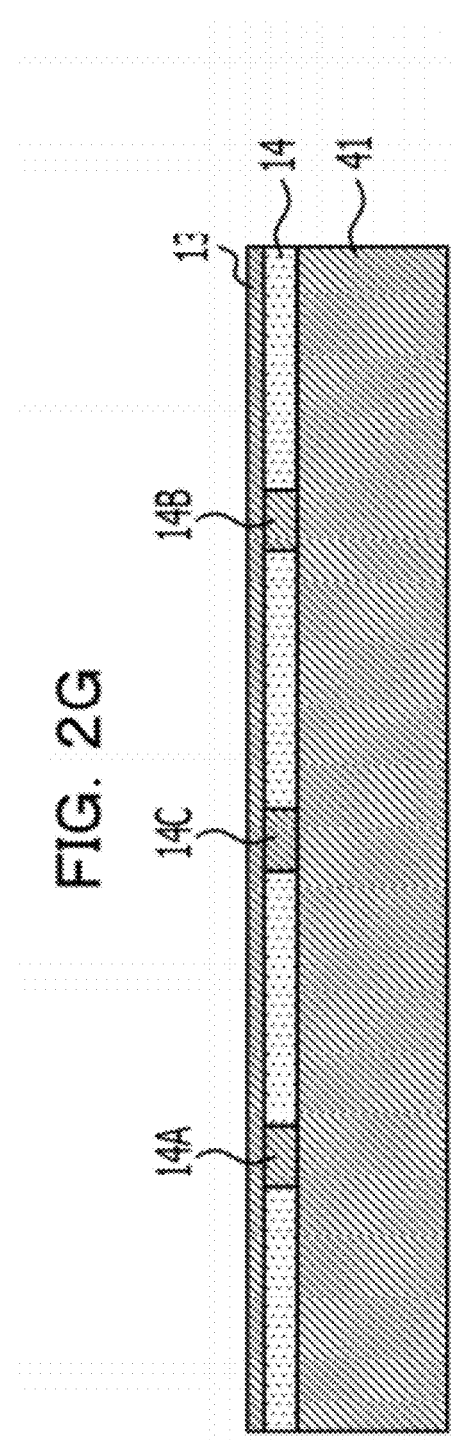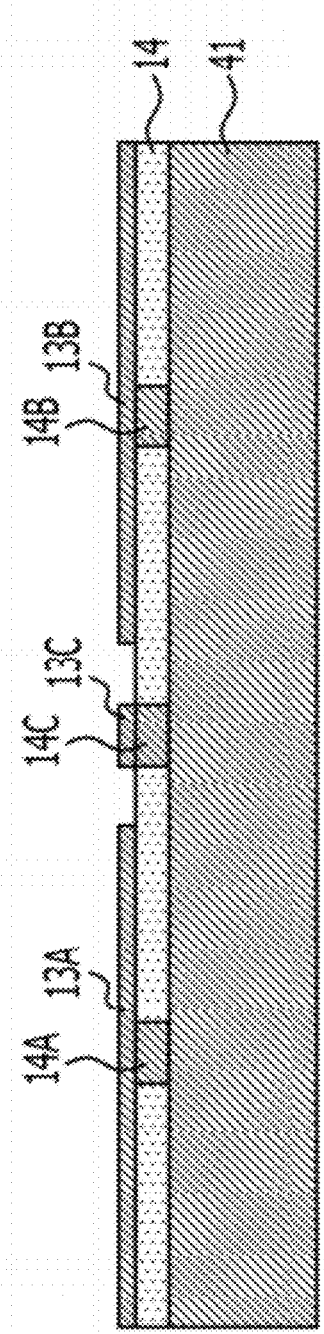

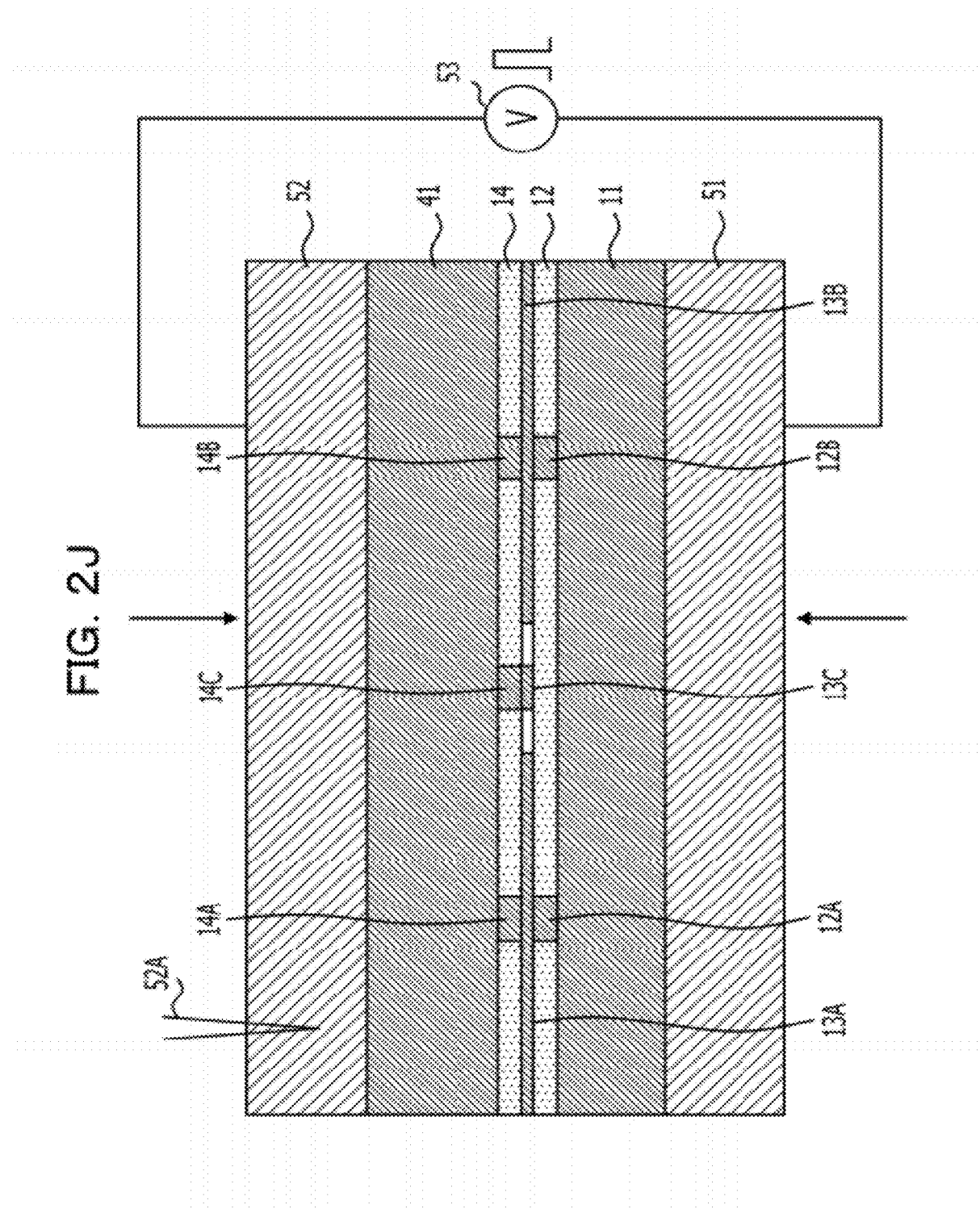

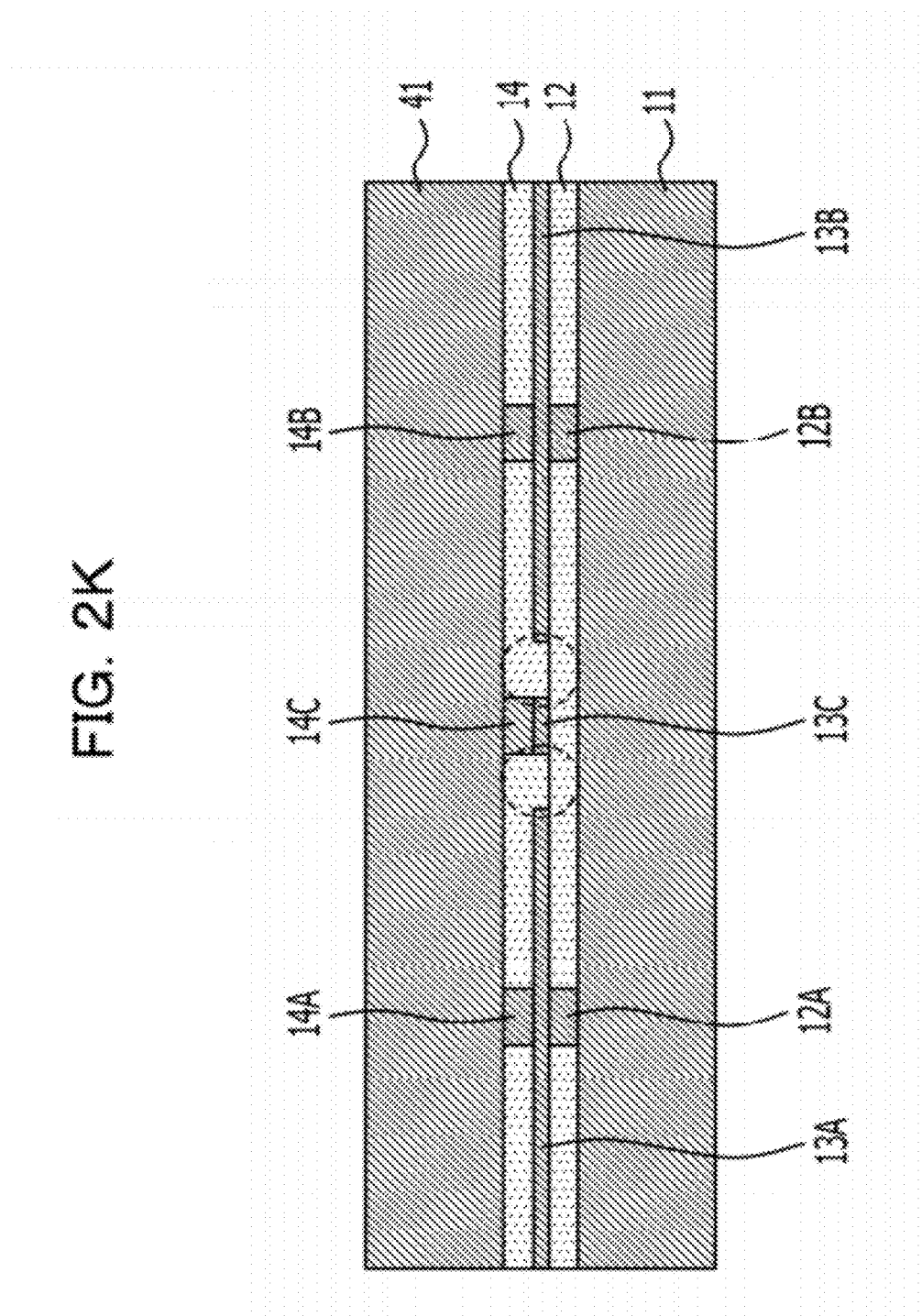

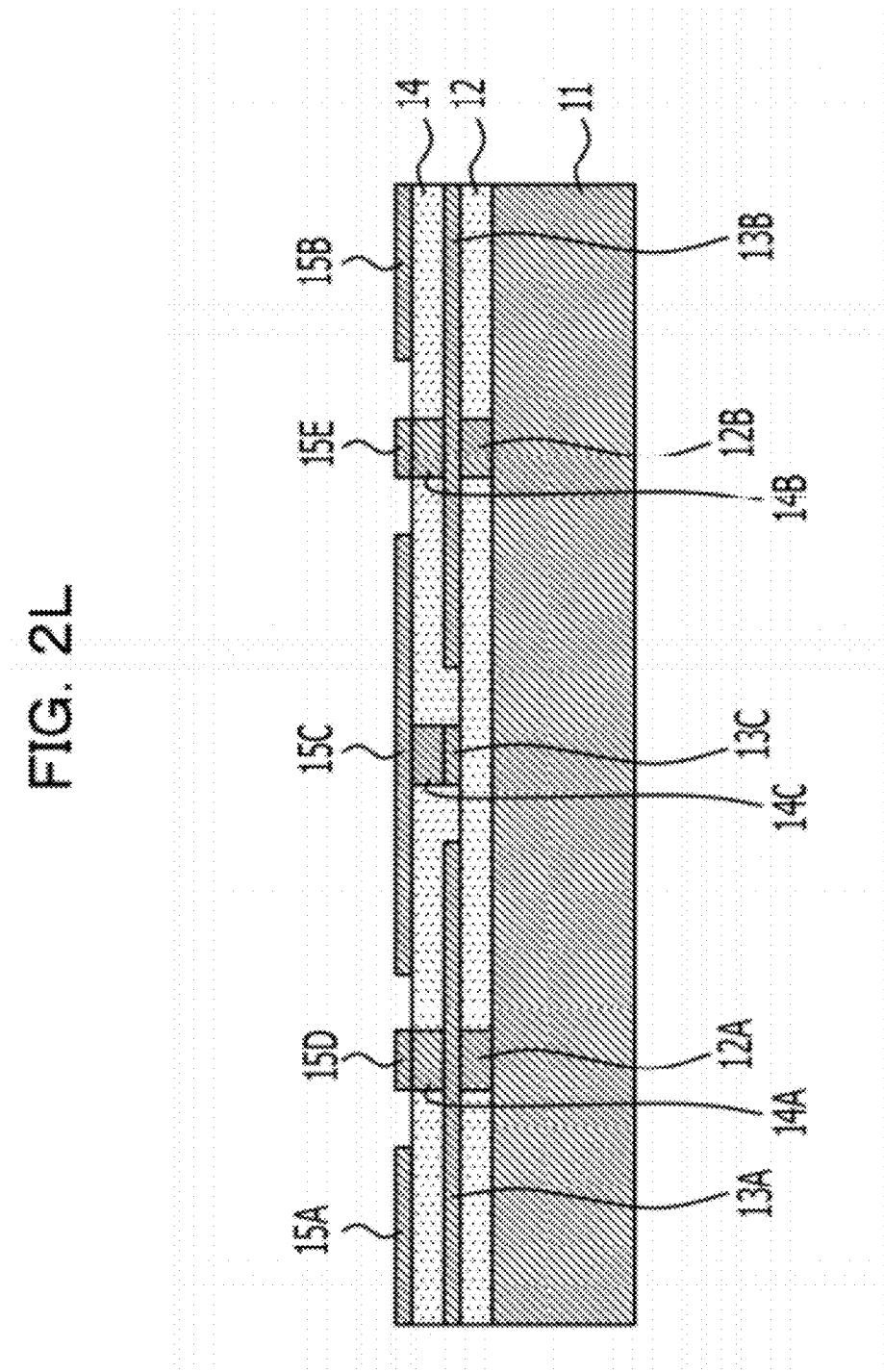

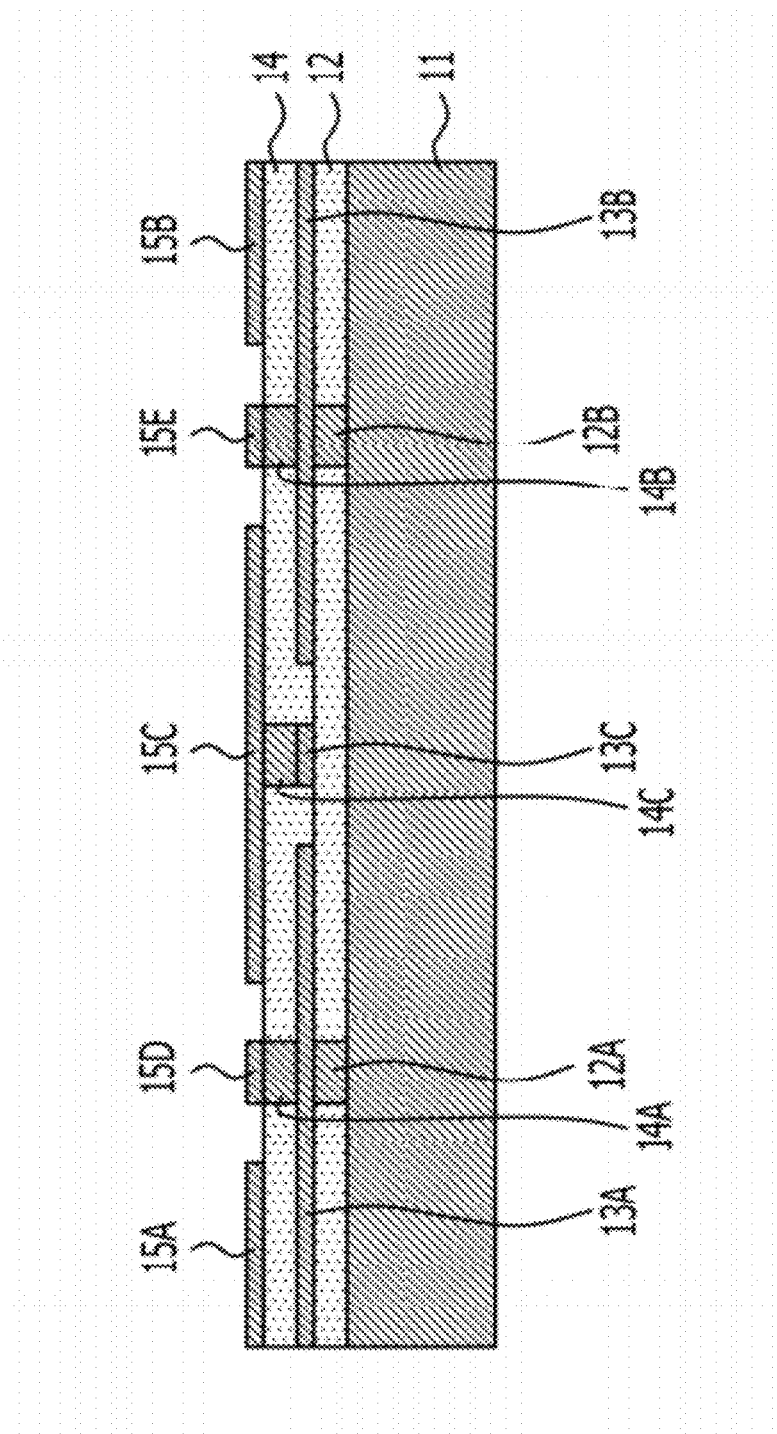

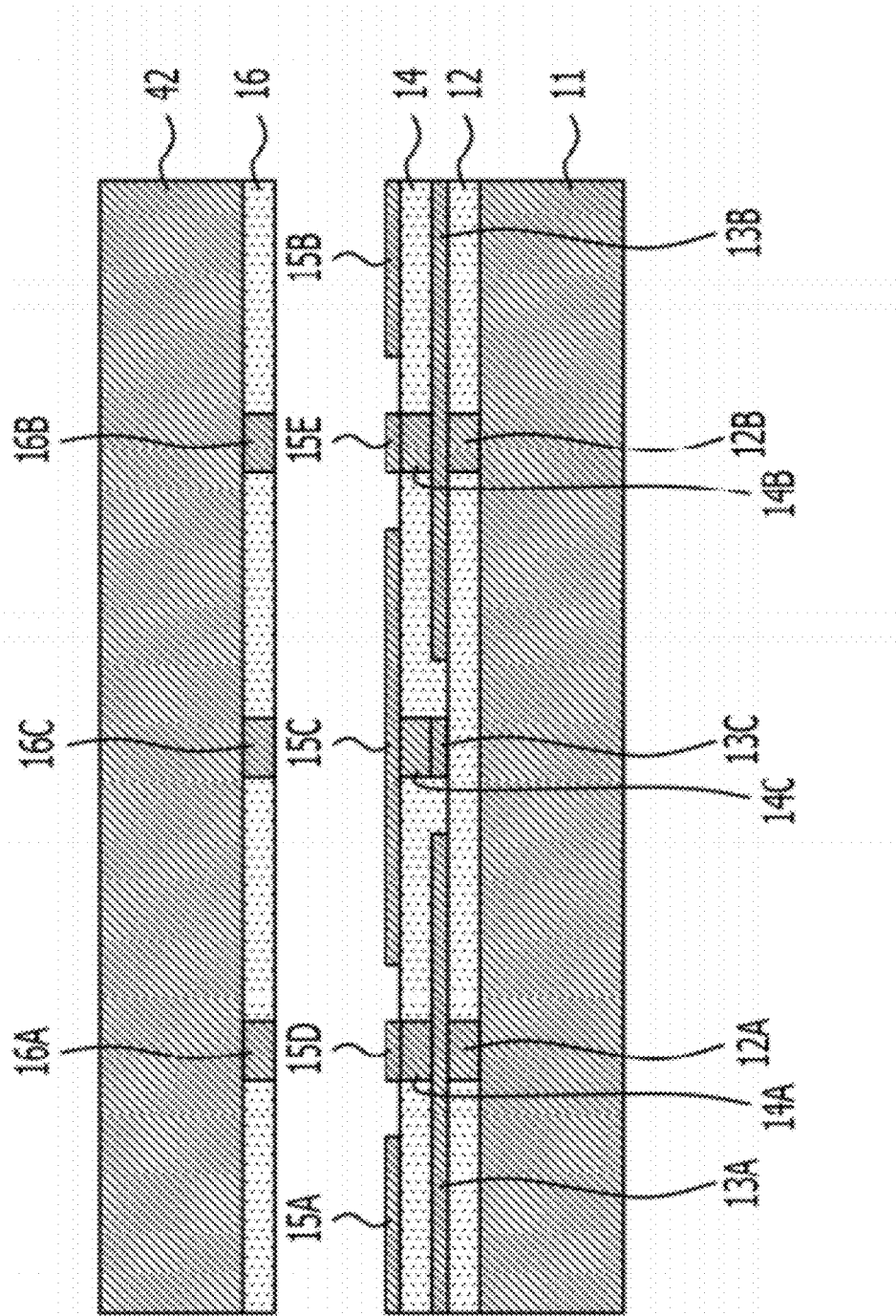

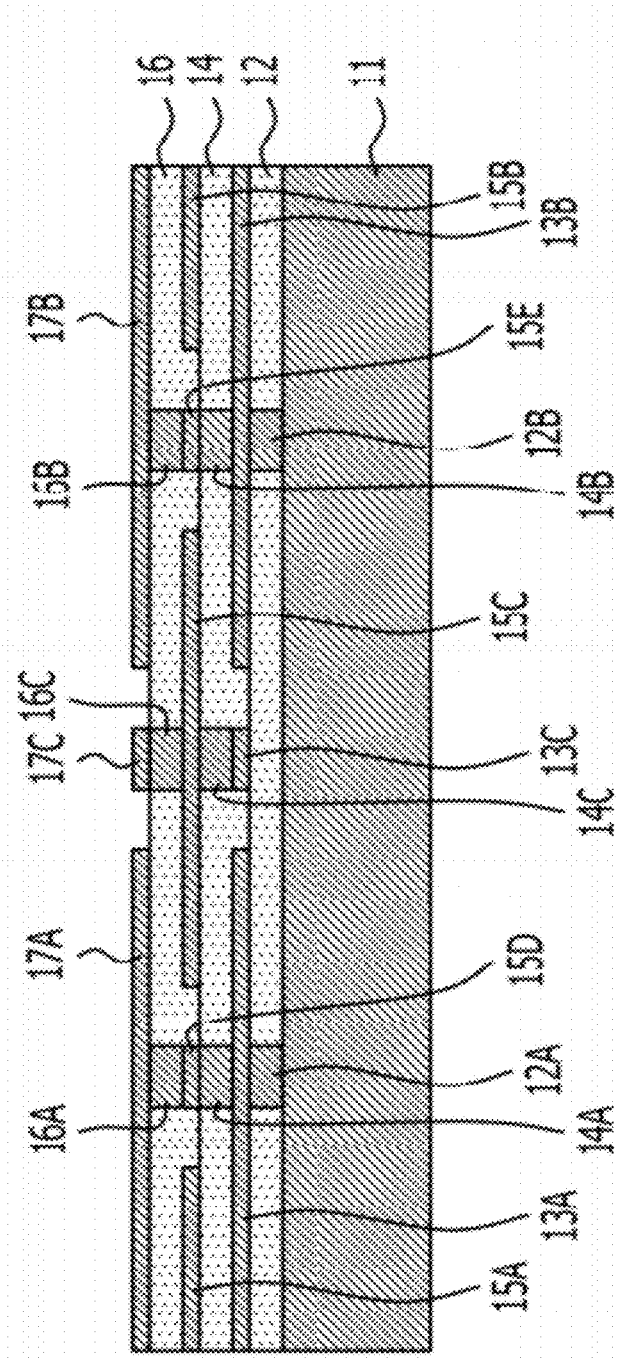

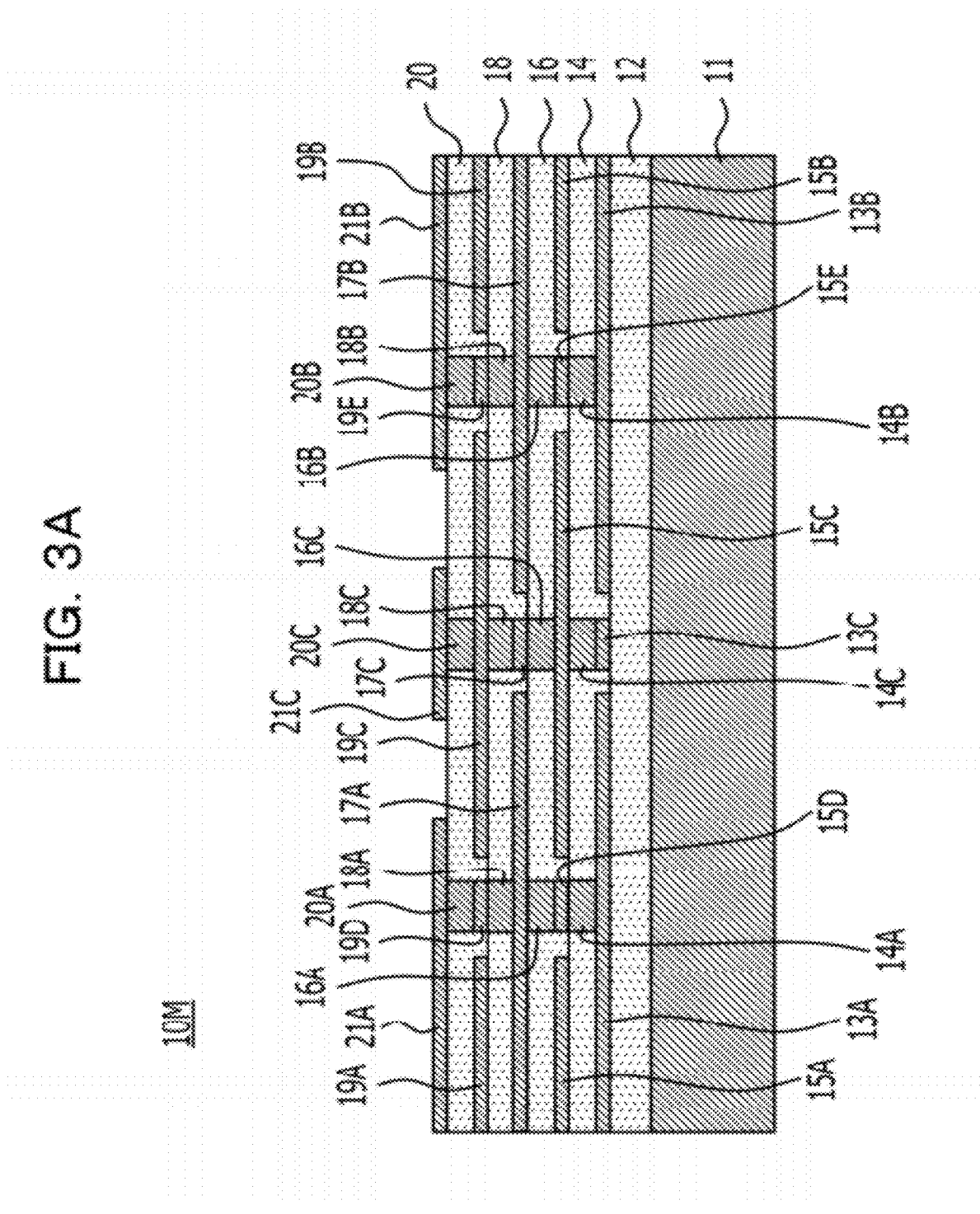

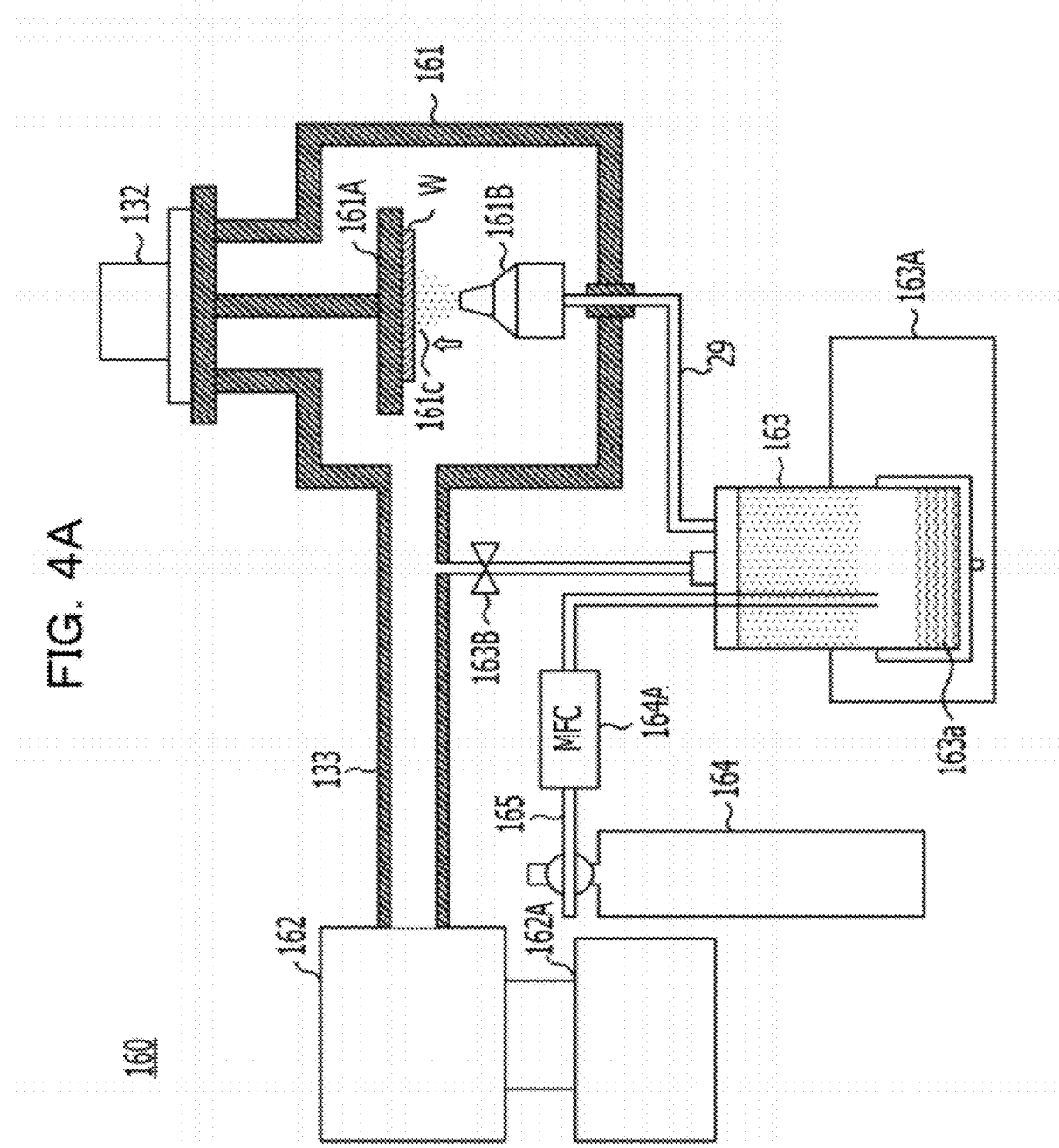

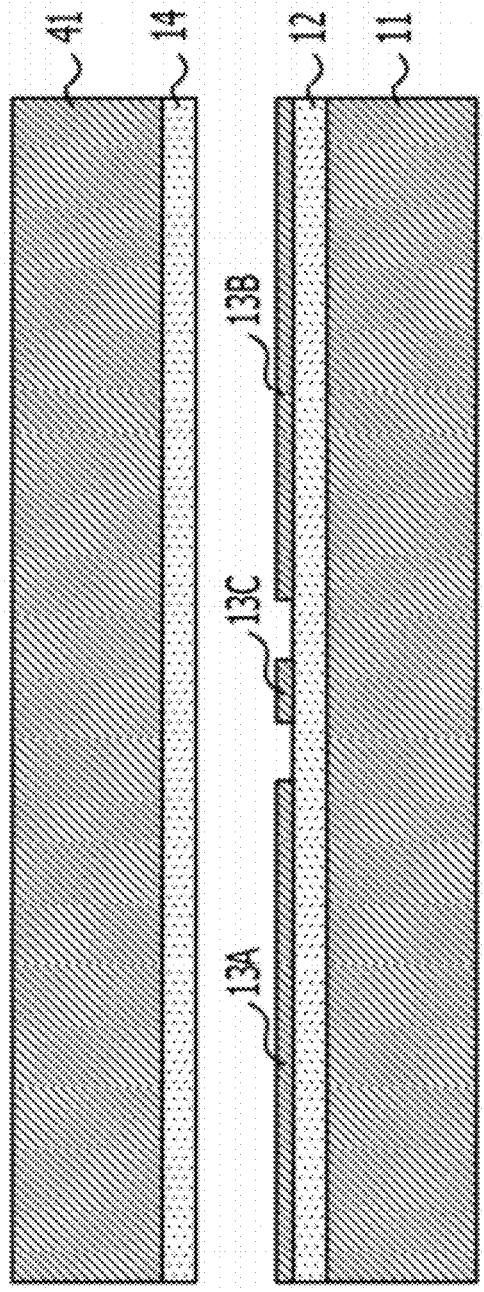

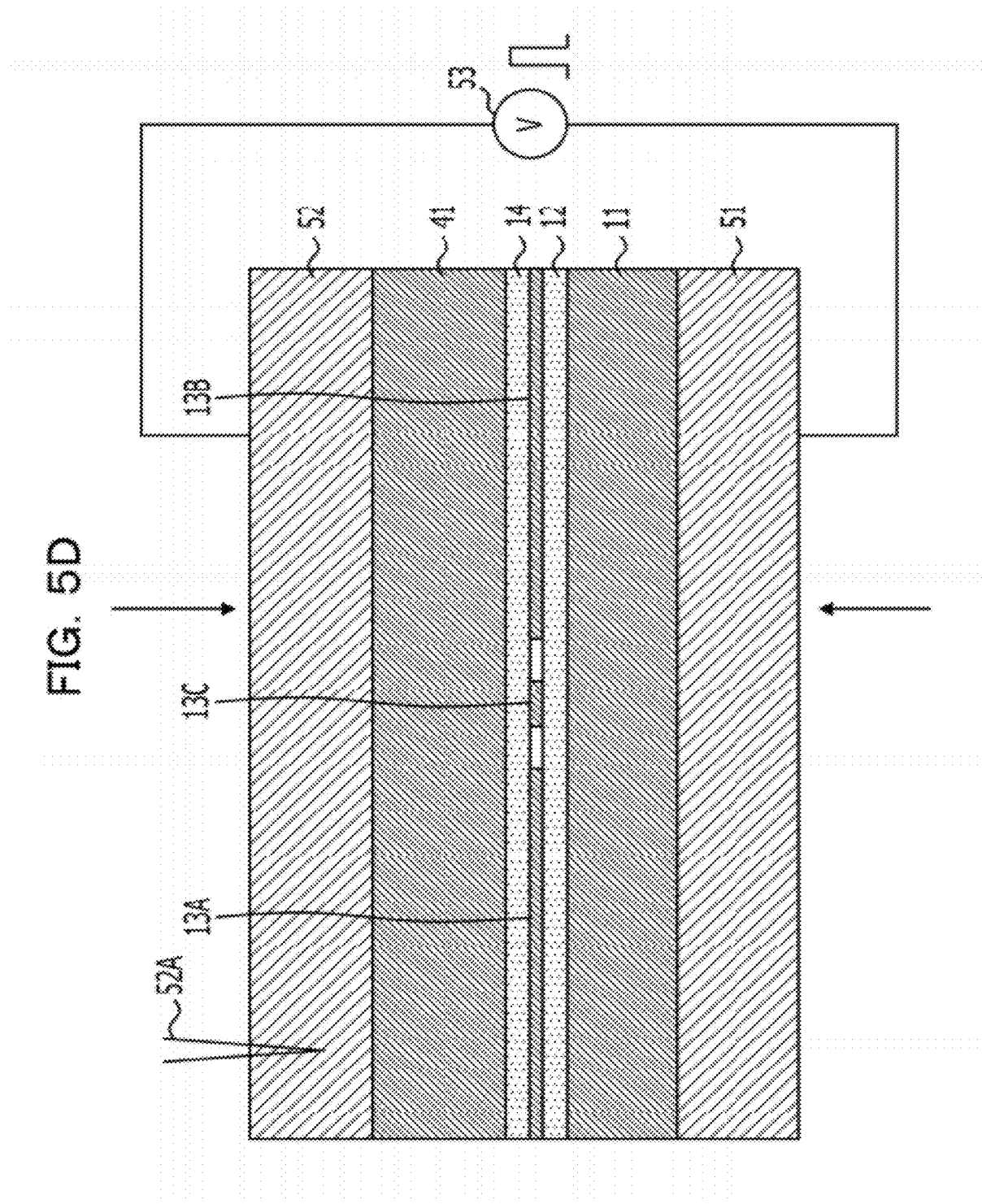

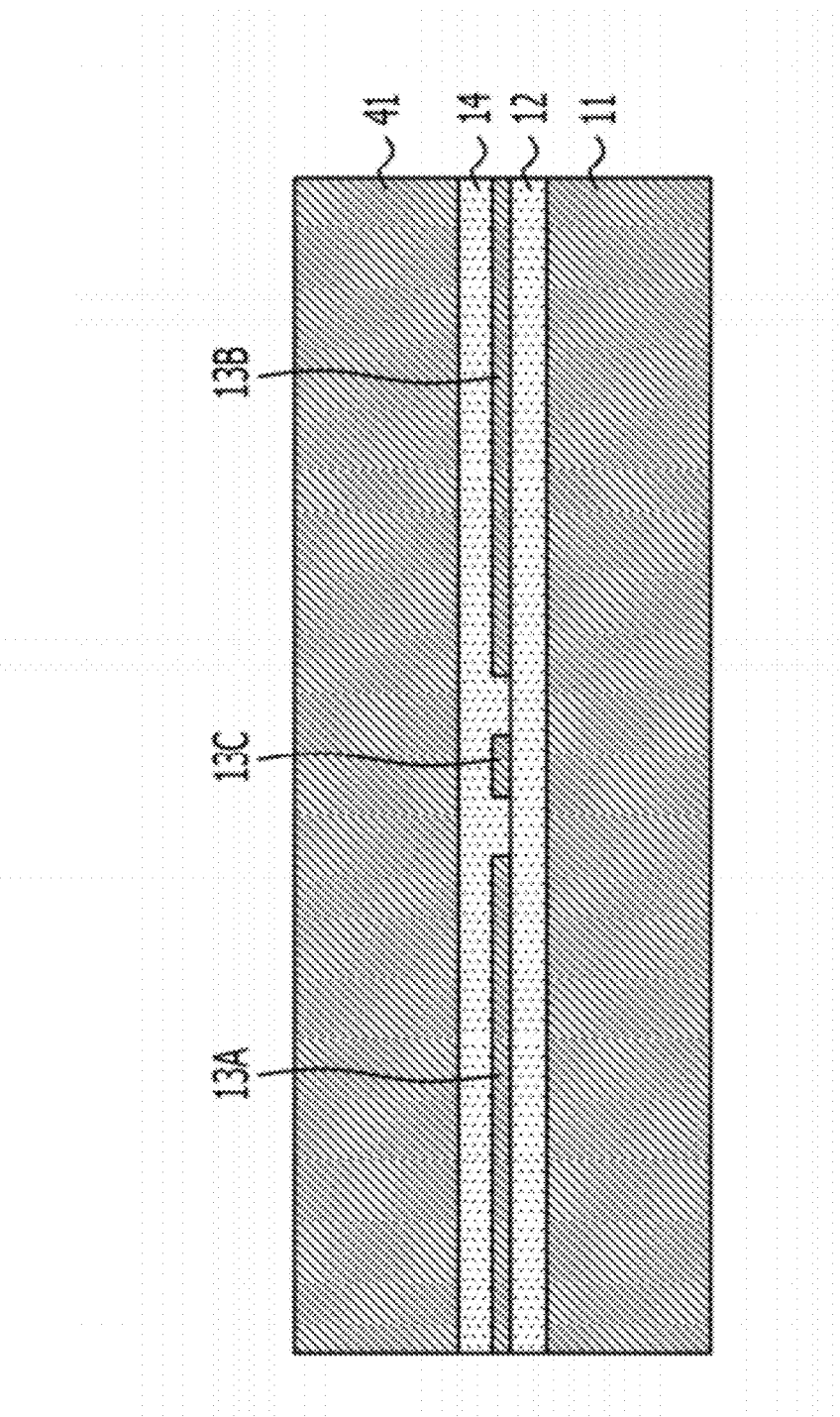

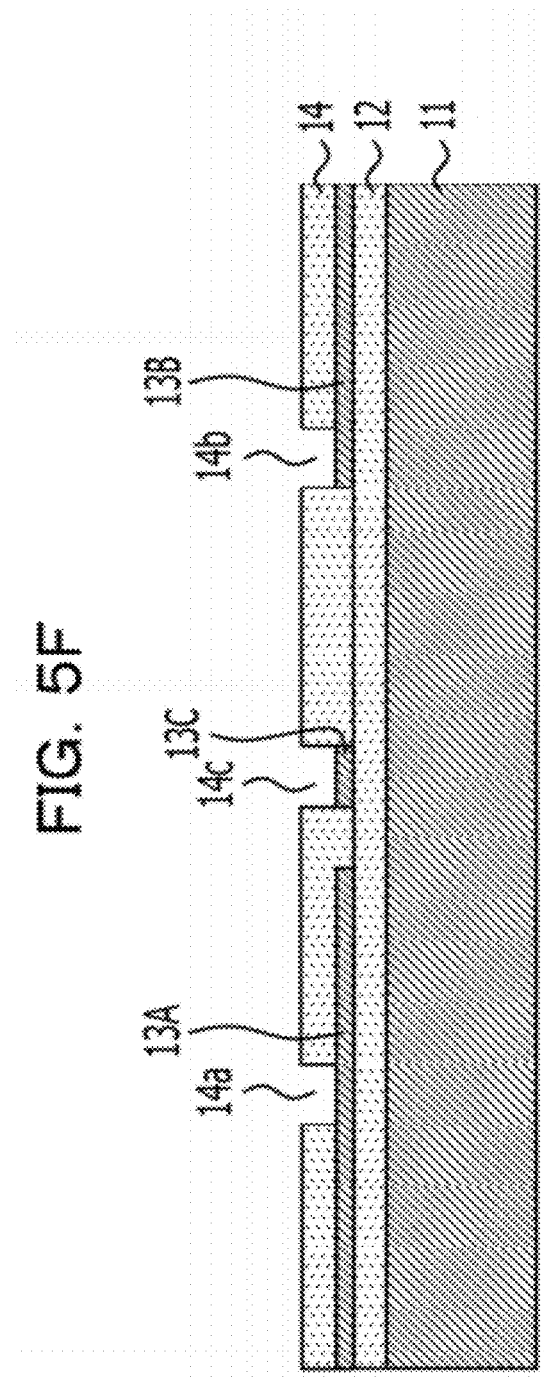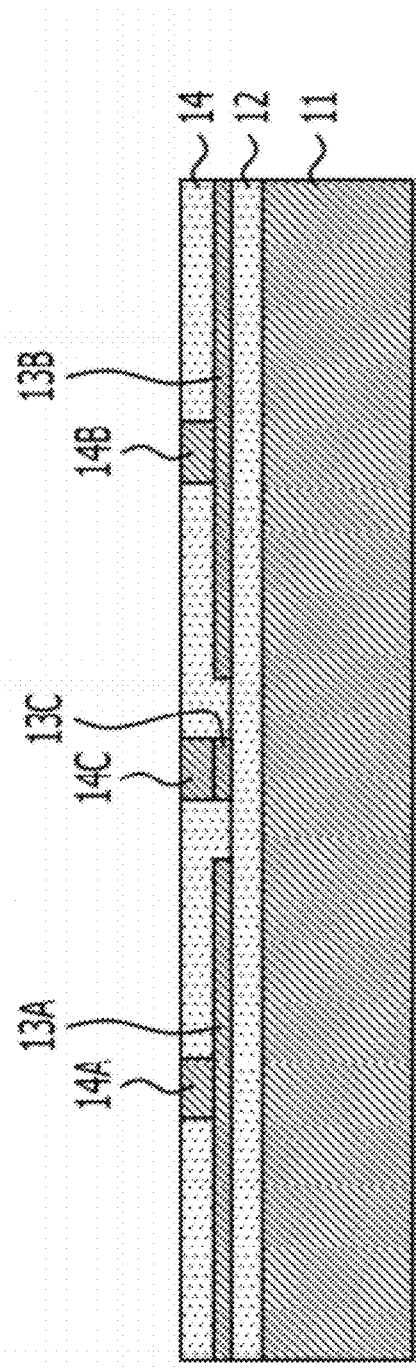

LAMINATE STACKED CAPACITOR, CIRCUIT SUBSTRATE WITH LAMINATE STACKED CAPACITOR AND SEMICONDUCTOR APPARATUS WITH LAMINATE STACKED CAPACITOR

CROSS-REFERENCE TO RELATED APPLICATION

This application is based upon and claims the benefit of priority of the prior Japanese Patent Application No. 2010-203637, filed on Sep. 10, 2010, the entire contents of which are incorporated herein by reference.

FIELD

The embodiments discussed herein are related to a method for manufacturing capacitor, and to a capacitor, a circuit substrate and a semiconductor apparatus.

BACKGROUND

As electronic apparatuses are miniaturized and their performances are increased, it is desirable that mounting techniques be improved in terms of the miniaturization and performance increase.

In circuit substrates used in electronic apparatuses and information processing apparatuses, such as personal computers and servers, logical elements, such as CPUs, are provided with a decoupling capacitor around them so that stable current supply can be ensured and/or so that noise can be removed even if the power-supply voltage fluctuates. This is increasingly important with the increase in operating frequency of CPUs and with the decrease in operating voltage.

In particular, in order to quickly compensate for the fluctuation of the voltage applied to the CPU, it is effective to control the impedance of the power-supply system including the decoupling capacitor. Accordingly, a high capacitance capacitor having a low inductance is desirable, and it is also desirable to reduce the length and hence the inductance of the power-supply wiring to the decoupling capacitor on the circuit substrate.

In order to reduce the inductance of the power supply wiring to the decoupling capacitor on the circuit substrate, it is believed that the most effective approach is to dispose a decoupling capacitor immediately under the CPU and to dispose the decoupling capacitor within the circuit substrate. This structure can lead to a cost reduction in manufacturing semiconductor devices and circuit substrates.

Related art references include the following documents:

Japanese Laid-open Patent Publication No. 2009-524259 (corresponds to US Publication No. 2007/0222030);

Japanese Laid-open Patent Publication No. 05-347227;

Japanese Laid-open Patent Publication No. 2007-318089 (corresponds to US Publication No. 2007/0263364); and Takeuchi, T. et al., J. Mater. Res. Vol. 18, No. 8, August 2003, pp. 1809-1815.

In a method proposed for incorporating a decoupling capacitor into a circuit substrate, a capacitor component is prepared by firing at a high temperature a multilayer structure including ceramic green sheets on which electrode patterns have been printed, and the resulting capacitor component is embedded in a circuit substrate. Another method has also been proposed in which a capacitor dielectric film is formed for each of a plurality of build-up layers, and the thus formed capacitor dielectric films are stacked in a process for forming a build-up circuit substrate.

Recently, a capacitor has been proposed which includes a platinum lower electrode on a silicon substrate coated with a silicon oxide film, a highly dielectric or ferroelectric ceramic dielectric film formed on the lower electrode by sputtering, a platinum upper electrode on the ceramic dielectric film, and connection electrodes extending upward respectively from the lower electrode and the upper electrode.

For a circuit substrate containing a completed capacitor component, the capacitor component is generally prepared by firing a stack of a plurality of green sheets containing a large amount of organic binder on each of which an electrode pattern has been printed. However, in this instance, the green sheets are significantly shrunk by the firing. Accordingly, it is difficult to form a fine electrode pattern on such a green sheet. For mounting a capacitor component on a circuit substrate, a high-resistance solder is used for bonding. The high-resistance solder increases the impedance of the power-supply system in the entire circuit substrate.

For preparing a capacitor component by a green sheet method, the firing operation for forming a ceramic capacitor dielectric film from a green sheet is performed in an oxidizing atmosphere at a high temperature. Accordingly, capacitor electrodes and via-plugs of the capacitor component are formed of a heat-resistant metal, such as nickel. However, heat resistant metals have higher resistivity than copper used for LSI wiring or the like, and result in increased impedance.

In a capacitor element including a platinum capacitor electrode, the impedance of the element is increased because of the high resistivity of platinum. Also, ceramic dielectric films formed by sputtering, which are amorphous, are heat-treated to be crystallized. However, this heat treatment is likely to cause the dielectric film to crack, and consequently, leakage current can occur undesirably.

From the viewpoint of reducing the impedance, it is desirable that the electrode pattern and via-plugs in the capacitor component be formed of copper, which has low resistivity. However, copper has the melting point of 1084° C. while the firing of known green sheets is performed at a temperature of at least about 1500° C. It is therefore impossible to form an electrode pattern or via-plugs in a capacitor component having a structure in which ceramic dielectric films are disposed on top of one another by a known technique.

In the structure in which capacitor dielectric films are disposed on t of one another in a build-up substrate, the thickness of the entire capacitor becomes the same as the total thickness of the build-up layers. This structure requires longer via-connection and results in an increase in impedance. In addition, this structure increases the number of insulating layers of the circuit substrate, and accordingly increases the number of process steps. Consequently, the manufacturing cost is increased, and, further, the total thickness of the circuit substrate is increased to increase the impedance of the signal line. The capacitor dielectric films for respective build-up layers are formed by a low-temperature process such as sputtering so as to reduce and/or prevent damage to the build-up layers. However, the capacitor dielectric films formed at a low temperature are typically amorphous. Thus, even though a high dielectric material or a ferroelectric material that can originally achieve a high relative dielectric constant of 1000 or more is used, its relative dielectric constant is not more than about 40, and a satisfactory capacitor component cannot be achieved. A build-up substrate may be made of a composite material containing a resin and a high-dielectric ceramic. In this instance, however, the dielectric constant of the composite material is not more than about 50 due to the effect of the resin (typically, epoxy resin) having a low dielectric constant.

SUMMARY

According to an aspect of the embodiment, a method of manufacturing a capacitor is provided. In the method, a first ceramic film is formed on a first metal base, and a second ceramic film is formed on a second metal base. A first copper electrode pattern and a first copper via-plug are provided for a surface of one of the first and second ceramic films in such a manner that the electrode pattern and the via-plug are separate from each other. The first and second ceramic films are bonded together with the first electrode pattern therebetween by applying a pulsed voltage between the first base and the second base while the first base and the second base are pressed so that the first ceramic film and the second ceramic film are pressed on each other. Then, the second base is removed.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 3A and 3B are sectional views of modifications of the first embodiment;

FIGS. 4A to 4C are a schematic representation of the structure of an aerosol deposition apparatus, a representation of a state where deposition is performed using the aerosol deposition apparatus, and transmission electron micrographs of a section of a dielectric film obtained using the aerosol deposition apparatus, respectively.

FIGS. 5A to 5H are representations of a method of manufacturing a capacitor element according to a second embodiment;

DESCRIPTION OF EMBODIMENTS

First Embodiment

Figure 1:
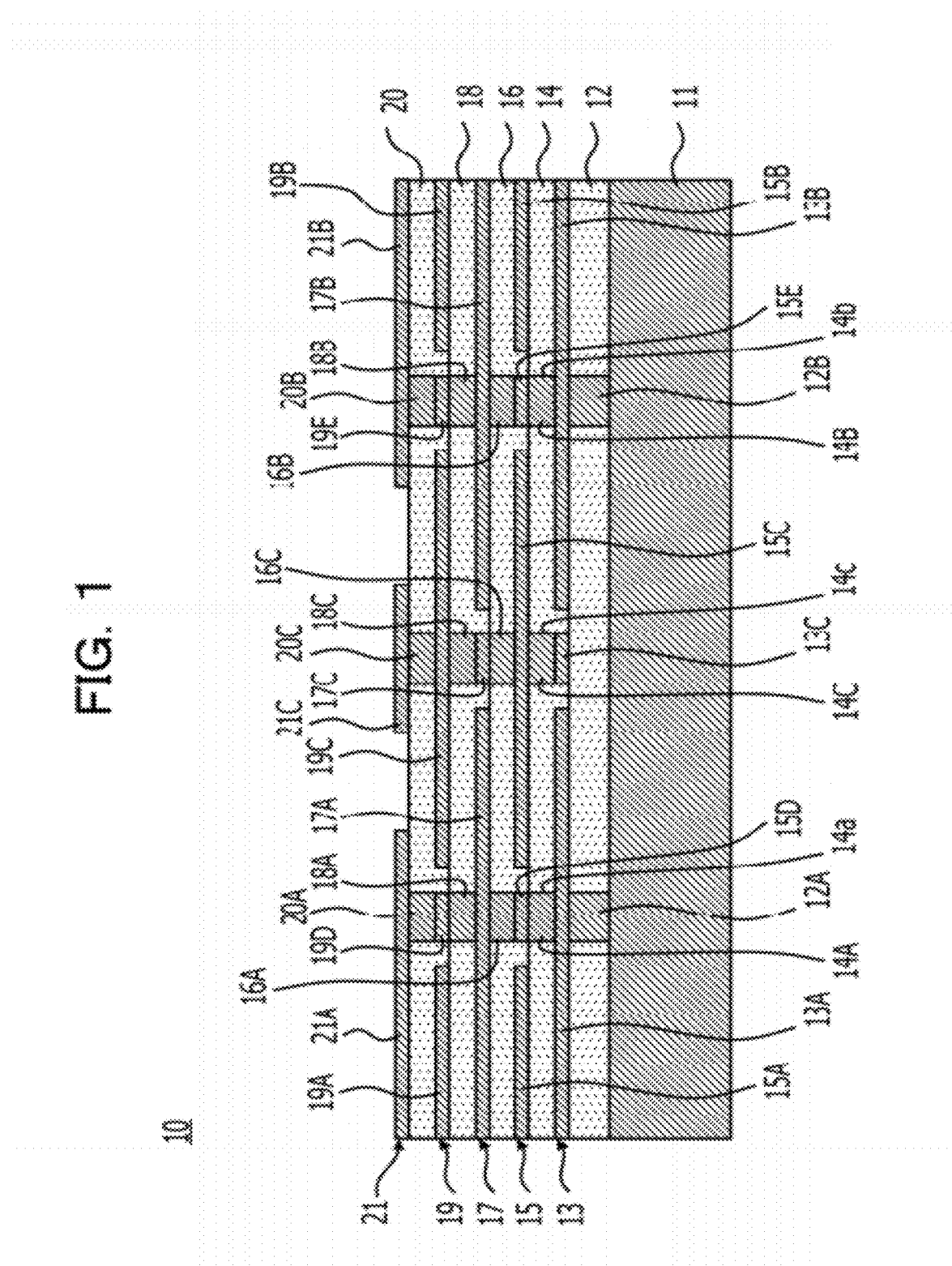
FIG. 1 is a sectional view of a capacitor element according to a first embodiment.

FIG. 1 is a sectional view of a capacitor element according to a first embodiment;

Referring to FIG. 1, a capacitor element 10 includes a base 11 and a stack of dielectric films 12, 14, 16, 18 and 20 on the base 11. The base 11 may be made of copper and have a thickness of 1 μm to 50 μm, preferably a thickness smaller than the thickness of a single build-up layer of a build-up circuit substrate, such as 16 μm. The dielectric films are made of, for example, barium titanate ($BaTiO_3$) and have a thickness in the range of 0.3 μm to 5 μm, such as 1 μm. The dielectric films 12, 14, 16, 18 and 20 are formed on top of one another by aerosol deposition, as will be described in detail. Each of the dielectric films 12, 14, 16, 18 and 20 has been heat-treated at a temperature lower than the melting point of copper. Consequently, each dielectric film is fired, and thus has a granular structure having an average grain size in the range of 5 nm to 500 nm.

A copper layer 13 is disposed between the dielectric films 12 and 14; a copper layer 15 is disposed between the dielectric films 14 and 16; a copper layer 17 is disposed between the dielectric films 16 and 18; a copper layer 19 is disposed between the dielectric films 18 and 20; and an uppermost copper layer 21 is disposed on the dielectric film 20. These copper layers are formed to a thickness of 200 nm to 500 nm by sputtering. As an alternative to sputtering, the copper layers 13, 15, 17, 19 and 21 may be formed by electroplating or electroless plating. If the copper layers 13, 15, 17, 19 and 21 are formed by sputtering, a titanium or chromium film of several tens of nanometers in thickness may be formed to enhance the adhesion between the copper layers and the underlying dielectric films, for example, between the copper layer 13 and the dielectric film 12. However, if a recent advanced sputtering technique is applied, such an adhesion layer may be omitted, or is preferably omitted from the viewpoint of reducing resistance.

Copper layers are patterned into electrode patterns and via-plugs. For example, the copper layer 13 is patterned into electrode patterns 13A and 13B and a via-plug 13C. The dielectric film 14 covering the copper layer 13 is 7provided with openings 14a, 14b and 14c in which the electrode patterns 13A and 13B and the via-plug 13C are exposed, respectively. The openings 14a, 14b and 14c are filled with, for example, copper via-plugs 14A, 14B and 14C, respectively. The copper via-plugs 14A, 14B and 14C are formed by, for example, copper electroplating. The via-plugs 14A, 14B and 14C may be formed of gold, platinum, tungsten, molybdenum, nickel, chromium, titanium, palladium, iron or the like.

The copper layer 15 is patterned into electrode patterns 15A, 15B and 15C and via-plugs 15D and 15E. The dielectric film 16 covering the copper layer 15 is provided with copper via-plugs 16A and 16B corresponding to the via-plugs 15D and 15E, and with a copper via-plug 16C corresponding to the electrode pattern 15C.

The copper layer 17 is patterned into electrode patterns 17A and 17B and a via-plug 17C. The dielectric film 18 covering the copper layer 17 is provided with copper via-plugs 18A, 18B and 18C, corresponding to the electrode patterns 17A and 17B and the via-plug 17C, respectively.

The copper layer 19 is patterned into electrode patterns 19A, 19B and 19C and via-plugs 19D and 19E. The dielectric film 20 covering the copper layer 19 is provided with copper via-plugs 20A and 20B corresponding to the via-plugs 19D and 19E, and with a copper via-plug 20C corresponding to the electrode pattern 19C.

The copper layer 21 is patterned into electrode patterns 21A, 21B and 21C, corresponding to the via-plugs 20A to 20C, respectively. These electrode patterns 21A, 21B and 21C doubles as a connection wiring pattern on the top of the capacitor.

The dielectric film 12 is provided with copper via-plugs 12A and 12B therein, corresponding to the electrode patterns 13A and 13B, respectively.

In the capacitor element 10 shown in FIG. 1, the electrode patterns 13A and 17A are electrically connected to the base 11 and the electrode pattern 21A through the via-plugs 12A, 14A, 15D, 16A, 18A, 19D and 20A, and the electrode patterns 15C and 19C are electrically connected to the electrode pattern 21C through the via-plugs 13C, 14C, 16C, 17C, 18C and 20C. Also, the electrode patterns 13B and 17B are electrically connected to the base 11 and the electrode pattern 21B through the via-plugs 12B, 14B, 15E, 18B, 19E and 20B.

In this structure, the electrode patterns 13A and 13B oppose the electrode pattern 15C with the dielectric film 14 therebetween, and these opposing electrode patterns define a capacitor therebetween. Similarly, the electrode patterns 15C opposes the electrode patterns 17A and 17B with the dielectric film 16 therebetween, and these opposing electrode patterns define a capacitor therebetween. Also, the electrode patterns 17A and 17B oppose the electrode pattern 19C with the dielectric film 18 therebetween, and these opposing electrode patterns define a capacitor therebetween.

Accordingly, when a ground voltage is applied to the base 11 or the electrode patterns 21A and 21B and a supply voltage is applied to the electrode pattern 21C, for example, the above-described capacitors are connected in parallel between the supply voltage and the ground voltage, so that the capacitor element 10 can function as an effective decoupling capacitor. In this instance, the thicknesses of the dielectric films 12 to 20 are small as 0.3 µm to 5 µm. For example, if the thickness of each dielectric film is 1 µm, the total thickness of the multilayer structure of the five dielectric films 12 to 20 is not more than about 5 µm. Accordingly, the resistances and inductances of the current supply line including the via-plugs 12A, 14A, 15D, 16A, 18A, 19D and 20A and the current supply line including the via-plugs 13C, 14C, 16C, 17C, 18C and 20C can be reduced.

Thus, the capacitor element 10 shown in FIG. 1 can be formed at a total thickness of not more than about 20 µm, or less than 20 µm, in total including the substrate 16. Accordingly, it can be embedded in a single build-up layer or at most several build-up layers of a circuit substrate on which semiconductor chips are to be mounted.

In the capacitor element 10, the current line including the via-plugs 12A, 14A, 15D, 16A, 18A, 19D and 20A and the current line including the via-plugs 12B, 14B, 15E, 18B and 20B are connected to the base 11. Therefore, when the capacitor element 10 is embedded in a circuit substrate, such as a build-up substrate, as will be described below, either the ground voltage or the supply voltage can be applied from the rear side of the circuit substrate at a minimum distance. Thus, the occurrence of parasitic inductance in the circuit substrate can be effectively reduced and/or prevented.

In the first embodiment, the material of the dielectric films 12, 14, 16, 18 and 20 can be a material having a base composition such as $PbZrTiO_3$, $(Ba,Sr)TiO_3$, $Ba(Zr,Ti)O_3$, $KNbO_3$, $K_{0.5}Na_{0.5}NbO_3$, $KNbO_3 \cdot NaNbO_3 \cdot LiNbO_3$, $(Bi_{1/2}K_{1/2})TiO_3$, $(Bi_{1/2}Na_{1/2})TiO_3$, $BiFeO_3$, $(Sr,Ca)_2NaNb_5O_{15}$, $(Sr,Ba)NbO_6$, $Ba_2(Na,K)Nb_5O_{15}$, $Bi_4Ti_3O_{12}$, $SrBiTiTaOO_3$, $SiBi_2Ta_2O_9$, $SrBi_2Nb_2O_9$, $(Sr,Ca)_2Bi_4Ti_5O_{18}$, $CaBi_4Ti_4O_{15}$, $LiNbO_3$, $LiTaO_3$ or $PbNb_2O_6$, or a high dielectric oxide or a ferroelectric oxide, without being limited to $BaTiO_3$.

A method of manufacturing the capacitor element 10 shown in FIG. 1 will now be described with reference to FIGS. 2A to 2P.

Figure 2A:
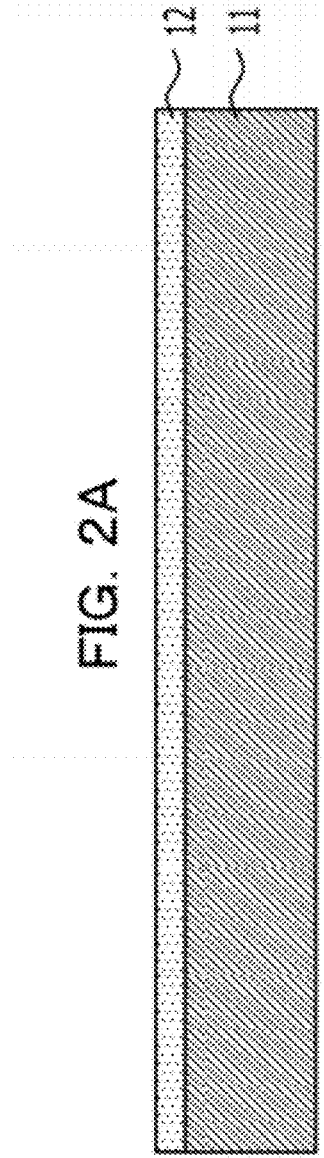
FIGS. 2A to 2P are representations of a method of manufacturing the capacitor element shown in FIG. 1.
Figure 4B:
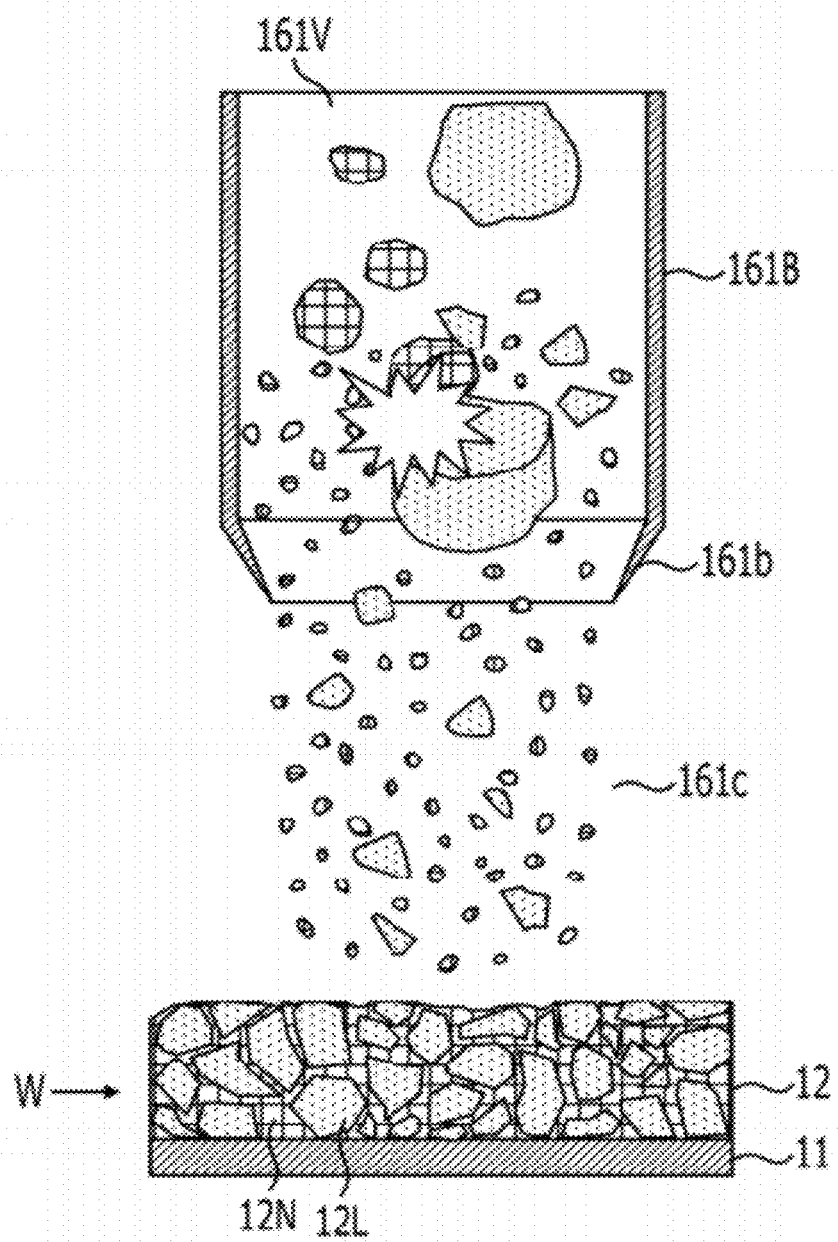
Figure 4C:
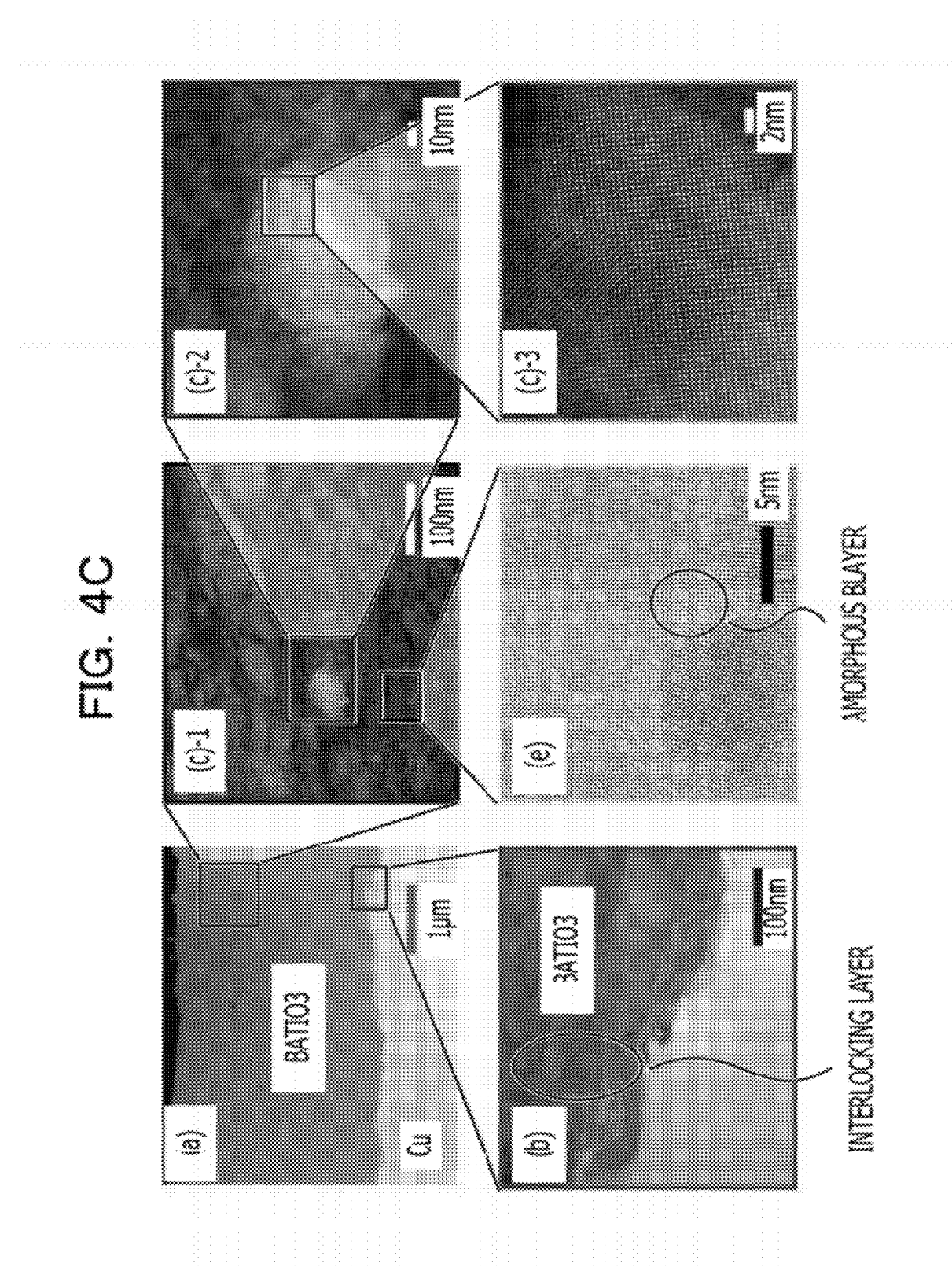

Referring to FIG. 2A, a $BaTiO_3$ dielectric film 12 is formed to a thickness of, for example, 1.5 µm on a copper base 11 having a thickness of, for example, 16 µm, using an aerosol deposition apparatus 160 shown in FIGS. 4A to 4C.

The aerosol deposition apparatus 160 shown in FIG. 4A includes a work container 161 that is evacuated by a mechanical booster pump 162 and a vacuum pump 162A through an evacuation channel 133. In the work container 161, a work substrate W is disposed on a stage 161A so as to be displaceable in the X, Y, Z and θ axis directions with an X-Y-Z-θ driving mechanism 132. The Z axis extends in the direction perpendicular to the surface of the stage 161A, the X and Y axes extend in directions perpendicular to the Z axis, and are also perpendicular to each other. θ represents a rotation on the Z axis.

In the work container 161, the work substrate W disposed on the stage 161A is opposed to a nozzle 161B to which aerosol of $BaTiO_3$ material powder is supplied with a dry carrier gas. The aerosol is sprayed as an aerosol jet 161c onto the surface of the work substrate W from the nozzle 161c. In this instance, the aerosol jet 161c does not contain solvent or any other liquid or a binder or any other organic material.

The $BaTiO_3$ powder in the aerosol sprayed on the work substrate W from the nozzle 161B is a mixture of large particles having particle sizes in the range of 50 nm to 300 nm and nanoparticles having particle sizes in the range of 1 nm to 20 nm. These particles are formed by pulverizing a material powder having larger particle sizes by mutual collision in the nozzle 161B, as schematically shown in FIG. 4B. The $BaTiO_3$ particles pulverized in the nozzle 161B, which have very active surfaces formed by the pulverization, are solidified effectively on the surface of the work substrate W by impact, and thus a closely packed $BaTiO_3$ film having a high relative density of 90% or more is formed as a dielectric film 12 on the base 11. In this state, the dielectric film 12 contains large grains 12L having grain sizes in the range of 50 to 300 nm and nanograins 12N having grain sizes in the range of 1 µm to 20 nm.

For forming a nozzle 161B, in an example, a carrier pipe 161V having a circular section and an inner diameter of 10 mm was provided with a nozzle open end portion 161b that had been formed by transforming a 10 mm long member into a shape having a length of 45 mm and a width gradually narrowed to 0.5 mm at the ejection face. The aerosol jet 161c was ejected through such a nozzle 161B. An aerosol jet of an active mixture containing large particles having particle sizes in the range of 50 nm to 300 nm and nanoparticles having particle sizes in the range of 1 nm to 20 nm can be produced from, for example, a material powder containing larger particles, such as commercially available $BaTiO_3$ material powder having an average particle size of 100 nm to 800 nm, by the above-described pulverization.

Referring again to FIG. 4A, the aerosol deposition apparatus 160 has a material container 163 containing a $BaTiO_3$ material powder 163a for supplying aerosol to the nozzle 161B. By supplying a carrier gas, such as an inert gas or highly pure oxygen, to the material container 163 from a high-pressure gas source 164 through a line 165 and a mass flow controller 164A, the aerosol is generated. The material container 163 shown in FIG. 4A is held on a vibration table 163A to promote the generation of the aerosol. When a valve 163B communicating with the evacuation channel 133 is opened before the generation of aerosol, the water in the material was removed by the pumps 162 and 162A.

More specifically, in the first embodiment, the material container 163 is charged with a commercially available $BaTiO_3$ material powder having an average particle size of 100 nm to 800 nm as the material 163a. Ultrasonic vibration is applied to the entirety of the material container 163 by operating the vibration table 163A. While the material powder is being heated at 150° C., the water absorbed in the surface of the material powder is removed by vacuum degassing with the valve 163B open.

After the valve 163B is closed, the pressure in the work container 160 is reduced to, for example, 10 Pa or less by operating the mechanical booster pump 162 and the vacuum pump 162A, and highly pure oxygen gas having a pressure of, for example, 2 kg/cm² is supplied to the material container 163 at a flow rate of, for example, 4 L/min from the high-pressure gas source 164 through the gas line 165 and the mass flow controller 164A. Thus, an aerosol of the BaTiO$_3$ material power is generated. The generated aerosol is supplied to the nozzle 161B from the material container 163 whose inner pressure is kept constant at 200 Pa.

The aerosol jet is ejected to the work substrate W from the nozzle 161B for, for example, 2 minutes. Thus, the dielectric film 12 is formed on the base 11 at a rate of, for example, 1 μm±0.5 μm/min, in the first embodiment.

FIG. 4C shows transmission electron micrographs of a section of the boundary between the thus formed BaTiO$_3$ dielectric film 12 and the copper base 11.

As shown in micrographs (a) and (b) in FIG. 4C, voids or any other defects were not observed in the boundary between the BaTiO$_3$ dielectric film 12 and the copper base 11. Also, micrograph (c)-1, which is an enlargement of a part of the section of the BaTiO$_3$ dielectric film 12, and micrograph (c)-2, which is a further enlargement of the enlarged portion shown in micrograph (c)-1, show that no void or no other defects are not observed in the BaTiO$_3$ dielectric film 12. Micrographs (c)-1 and (c)-2 show that the BaTiO$_3$ film 12 is made of large grains of about 50 nm to 300 nm in diameter, having an average grain size of about 100 nm, and small grains of about 1 nm to 20 nm in diameter, having an average grain size of about 10 nm, and has a section as schematically shown in FIG. 4B.

In particular, micrograph (b) in FIG. 4C shows that an interlocking layer having a thickness of about 500 nm in which copper and BaTiO$_3$ are interlocked with each other without forming a void is formed between the copper base 11 and the BaTiO$_3$ dielectric film 12. Also, micrograph (e) in FIG. 4C shows that an amorphous layer having a thickness of 1 nm or more is formed in the grain boundary of the adjacent crystal grains.

Furthermore, micrographs (c)-3 and (e), which are respectively an enlargement of a part of micrograph (c)-2 and an enlargement of a part of micrograph (c)-1, show that the lattice image of each BaTiO$_3$ crystal grain is observed.

A reciprocal lattice image was obtained from the lattice image by two-dimensional Fourier transform. As a result, the BaTiO$_3$ crystal has a (100) spacing of 0.401 nm, a (010) spacing of 0.382 nm, a (110) spacing of 0.279 nm, and an angle of 91.4° between the (100) plane and the (010) plane and an angle of 47.0° between the (100) plane and the (110) plane. Thus, it was confirmed that the BaTiO$_3$ crystal of the dielectric film is close to the ideal cubic BaTiO$_3$ crystal, which has a (100) spacing of 0.4031 nm, a (010) spacing of 0.4031 nm, and a (110) spacing of 0.2850 nm, and an angle of 90.0° between the (100) plane and the (010) plane and an angle of 45.0° between the (100) plane and the (110) plane.

Referring again to FIG. 2A, the BaTiO$_3$ dielectric film 12 formed as above is heat-treated at a temperature of less than 1084° C., which is the melting point of copper, for example, at 1000° C., to sinter the BaTiO$_3$ crystals in the dielectric film 12. Although BaTiO$_3$ films are generally sintered at a temperature of 1500° C. or more, the BaTiO$_3$ film formed by aerosol deposition can be sintered at a temperature of about 1000° C. because of the very small nanograins 12N contained in the BaTiO$_3$ film. Consequently, the crystal gains in the dielectric film 12 are grown by the sintering so that the fine structure of the BaTiO$_3$ film is changed into a granular structure having an average grain size in the range of 5 nm to 500 nm. Since the BaTiO$_3$ dielectric film 12 has a relative density of more than 90% in a state immediately after the aerosol deposition, it is hardly shrunk even by the sintering. Even if it shrinks about, for example, 0.5 μm in the thickness direction, shrinkage in the in-plane direction does not occur.

Figure 2B:
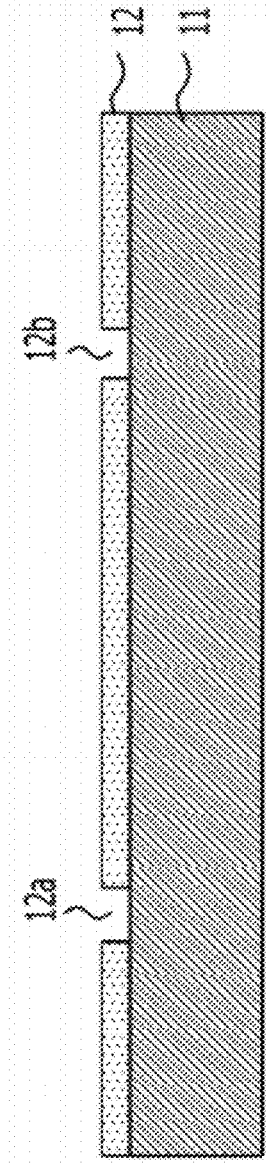
Figure 2C:
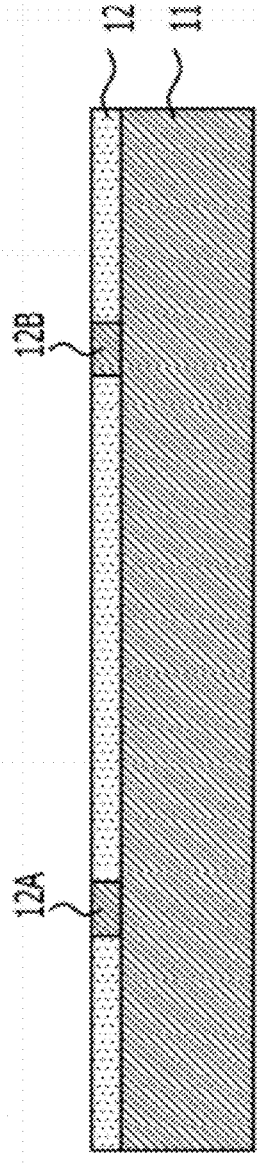

Turning now to FIG. 2B, via-holes 12a and 12b are formed in the dielectric film 12, corresponding to the via-plugs 12A and 12B by a resist process using photolithography and subsequent dry etching. Alternatively, the via-holes 12a and 12b may be formed by forming openings by a resist process, and by subjecting the portions of the openings to chemical etching using 5% hydrofluoric acid-nitric acid mixed solution. Then, copper shield films (not shown) are formed in the via-holes 12a and 12b by electroless plating, and electroplating is performed to fill the via-holes 12a and 12b with copper to form the via-plugs 12A and 12B. FIG. 2C shows a state where the undesired portions of the film formed by the electroless plating have been removed by wet etching after the formation of the via-plugs 12A and 12B. The copper base may be used as the shield layer to form the copper via-plugs in the via-holes.

In the first embodiment, at the same time as, or before or after the operations shown in FIGS. 2A to 2C, a second copper base 41 is prepared as shown in FIG. 2D, and via-holes 14a to 14c are formed in a dielectric film 14 formed on the base 41, corresponding to via-plugs 14A to 14D, as shown in FIG. 2E.

In the same manner as described with reference to FIG. 2C, via-plugs 14A to 14C are formed in the via-holes 14a to 14c as shown in FIG. 2F. The via-holes 12a and 12b and 14a to 14c may be formed by irradiation with a laser beam. In the method using a laser beam, when the underlying copper layer is exposed at the bottoms of the via-holes, the laser beam is reflected at the copper layer and the formation of the via-holes is automatically stopped. The via-holes and the via-plugs may be formed in the BaTiO$_3$ film heat-treated after aerosol deposition, or in the BaTiO$_3$ film immediately after the aerosol deposition without heat treatment.

The formation of the via-holes in the aerosol-deposited film may be performed immediately after the aerosol deposition, or after heat treatment. The via-holes can be formed by chemical etching using a hydrofluoric acid-nitric acid mixed solution, inductively coupled plasma (ICP) etching, reactive ion etching (RIE), ion milling, or dry etching using a laser beam, for example. In addition, a lift-off process may be applied in which a resist layer is formed before depositing a target material and is removed after the deposition.

A copper layer 13 is formed on the dielectric film 14 to a thickness of 200 nm to 500 nm by, for example, sputtering, as shown in FIG. 2G. As an alternative to sputtering, the copper layer 13 may be formed by electroless plating or electroplating.

For forming the copper layer 13 by sputtering, a titanium or chromium layer may be formed to several tens of nanometers as an adhesion layer on the dielectric film 14 before forming the copper layer 13, as described above. However, such an adhesion layer is liable to increase the resistance, and is preferably omitted.

Figure 2I:
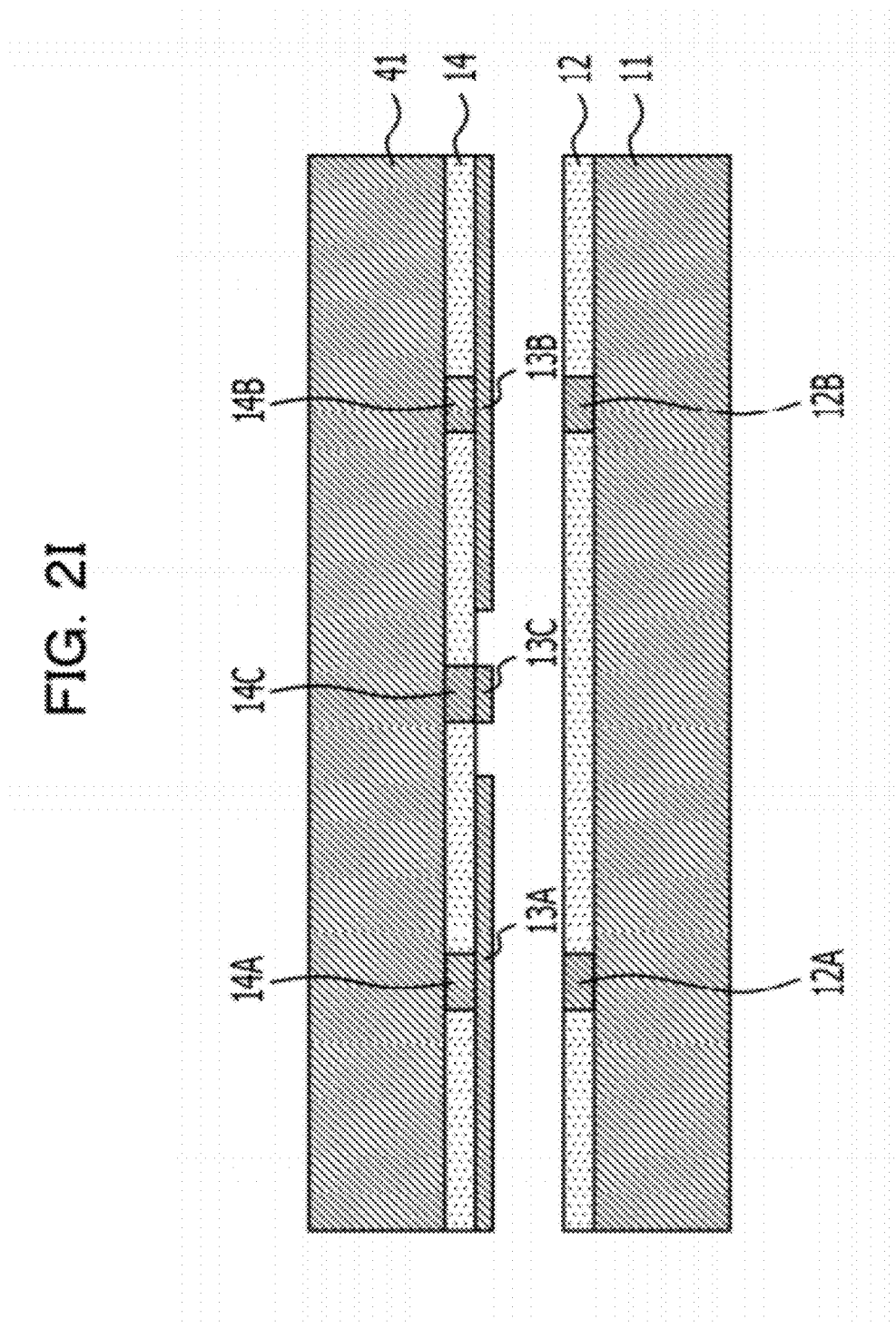

Subsequently, as shown in FIG. 2H, the copper layer 13 is patterned to form electrode patterns 13A and 13B and a via-plug 13C on the via-plugs 14A, 14B and 14C, respectively. Then, as shown in FIG. 2I, the structure including the base 41 and the layers formed on the base 41 is turned upside down and is, in this state, opposed to the structure shown in FIG. 2C so as to align the electrode pattern 13A and the via-plug 14A with the via-plug 12A and align the electrode pattern 13B and the via-plug 14B with the via-plug 12B.

Then, as shown in FIG. 2J, the dielectric films 12 and 14 with the above alignment are bonded together with the copper electrode patterns 13A and 13B and via-plug 13C therebetween. In this state, the dielectric film 14 is pressed on the dielectric film 12 in such a manner that the bases 11 and 41 are pressed at a pressure of 1 MPa to 50 MPa, such as 5 MPa, in the directions indicated by arrows shown in FIG. 2J in an atmosphere of an inert gas, such as nitrogen, or in a vacuum with jigs 51 and 52 made of a heat-resistant metal, such as molybdenum, tungsten, titanium or their alloy, or graphite.

In this state, a pulsed voltage of, for example, 12 V is repeatedly applied so that a current of about 100 A to 1500 A flows between the jigs 51 and 52 from a high-power pulsed power supply 53 at a frequency of, for example, 1 kHz, and thus pulsed electric current bonding is performed, as shown in FIG. 2J. Either of the jigs 51 and 52 is provided with a thermocouple 52A for measuring the temperature of the base 11 or 41. The pulsed electric current bonding is performed for 30 minutes while the temperature of the base 11 or 14 measured with the thermocouple 52A is being controlled to about 1000° C. As a result of the pulsed electric current bonding, the copper electrode patterns 13A and 13B are bonded to the corresponding via-plugs 12A and 12B and the $BaTiO_3$ dielectric film 12, and the copper via-plug 13C is bonded to the $BaTiO_3$ dielectric film 12. Thus a structure shown in FIG. 2K is prepared.

Although the portions surrounded by the broken lines in FIG. 2K have had gaps in the state shown in FIG. 2J, it is observed that they are filled with the $BaTiO_3$ dielectric film 14, and that the $BaTiO_3$ dielectric film 12 is bonded to the $BaTiO_3$ dielectric film 14 in a state where the boundary between the dielectric films 12 and 14 disappears. The reason of this is not clear at the current moment, but may be that a pulsed current flows along the grain boundaries in the dielectric films 12 and 14 by a mechanism similar to the mechanism in spark plasma sintering (SPS), and causes local melting, reaction or dispersion of the grain boundaries. Consequently, the $BaTiO_3$ grains may move so as to reduce the stress applied by the jigs 51 and 52.

In the structure shown in FIG. 2K, the $BaTiO_3$ dielectric films 12 and 14 are firmly bonded to each other by the pulsed electric current bonding, with the copper electrode patterns 13A and 13B and via-plug 13C therebetween.

After the base 41 has been removed to expose the surface of the dielectric film 14, as shown in FIG. 2L, by wet etching, a copper layer 15 (see FIG. 1) is formed over the surface of the dielectric film 14, and is then patterned to form electrode patterns 15A and 15B opposing the electrode patterns 13A and 13B with the dielectric film 14 therebetween, an electrode pattern 15C on the via-plug 14C, and via-plugs 15D and 15E on the via-plugs 14A and 14B, as shown in FIG. 2M.

Through the operations shown in FIGS. 2A to 2M, a first capacitor structure of the capacitor element 10 is prepared.

A series of these operations is repeated to form another capacitor structure on the capacitor structure shown in FIG. 2M.

Figure 2O:
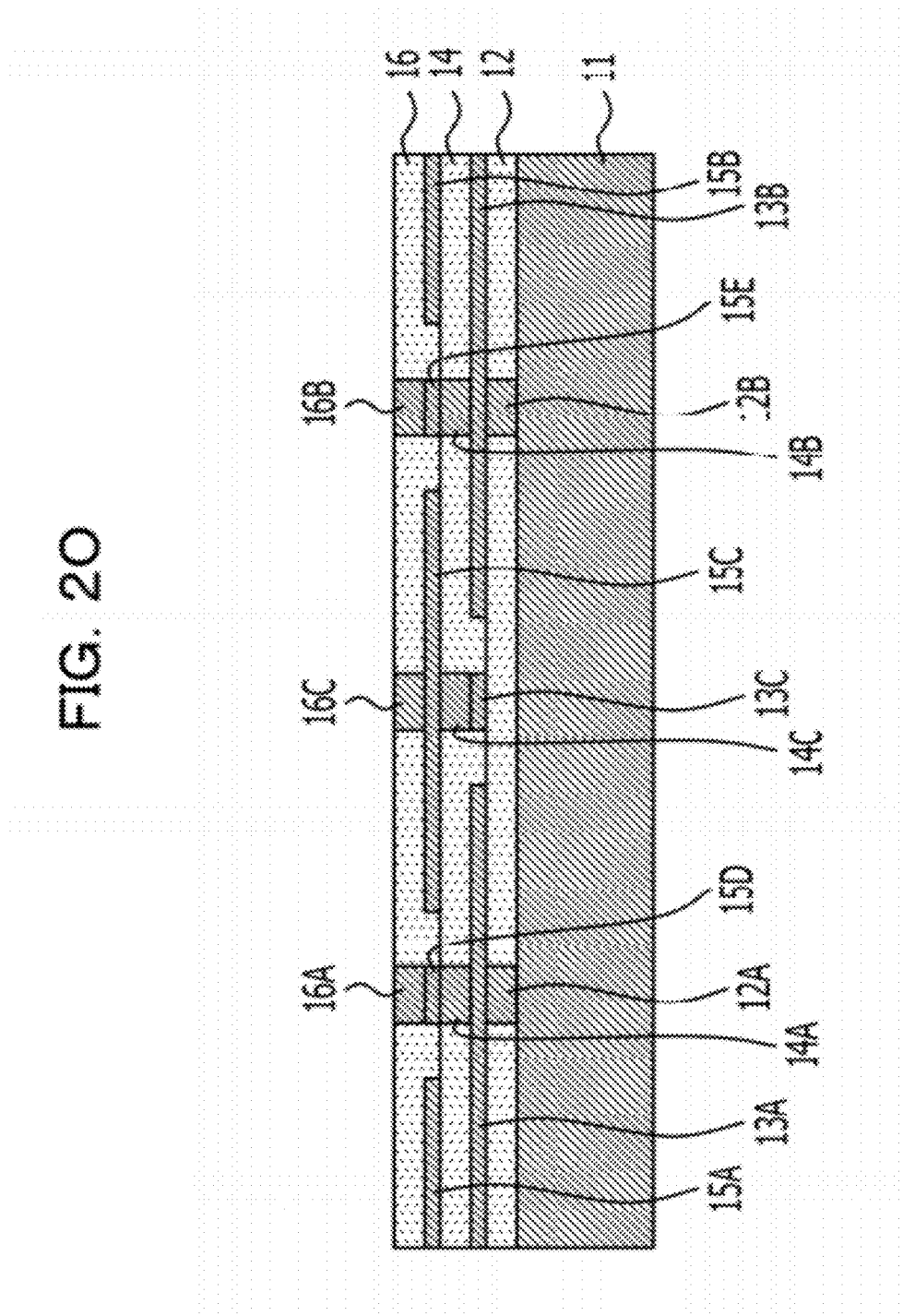

More specifically, as shown in FIG. 2N, a $BaTiO_3$ dielectric film 16 having via-plugs 16A to 16C is formed on the same base 42 as the base 41 in the same manner as the operations shown in FIGS. 2D to 2F, and the resulting structure is disposed upside down on the structure shown in FIG. 2M. Then, pulsed electric current bonding is performed under the same pressure as in the operation shown in FIG. 2J, and the base 42 is removed to yield the structure shown in FIG. 2O by etching.

Then, as shown in FIG. 2P, electrode patterns 17A and 17B and a via-plug 17C are formed respectively on the via-plugs 16A, 16B and 16C in the dielectric film 16. Thus, a second capacitor structure is formed on the capacitor structure shown in FIG. 2M.

By repeating the same operations, a desired number of layers can be formed in the capacitor element 10.

The copper electrode patterns 13A and 13B and via-plug 13C may be formed on the dielectric film 12, instead of the dielectric film 14, as is clear from FIGS. 2I and 2J.

If the copper bases 11 and 41 are heat-treated at a temperature in the range of 300° C. to 600° C. before the aerosol deposition shown in FIG. 2A or 2D, the warp of the bases resulting caused by membrane stress or the degradation of their surfaces can be reduced and/or prevented. However if the heat treatment is performed at a temperature of less than 300° C., the base 11 or 41 is warped by the aerosol deposition. Consequently, the patterns may be misaligned when a multilayer structure like the capacitor element 10 shown in FIG. 1 is formed. In contrast, if the heat treatment is performed at a temperature of more than 600° C., the strength of the bases 11 and 41 may be reduced, and their surfaces may become non-uniform. If the degree of the warp of the copper base 11 is so small as it is negligible in terms of pattern precision, the copper base 11 need not be heat treated from the viewpoint of cost reduction.

In the first embodiment, if the base 41 is made of copper, its thickness may be reduced instead of completely removing the base 41 by the operation shown in FIG. 2M, and the rest of the base 41 is then patterned into the electrode patterns 15A to 15C and the via-patterns 15D and 15E.

The via-plugs 12A and 12B may be omitted without being formed in the dielectric film 12, as in the structure 10M of a modification shown in FIG. 3A. In this instance, however, when the capacitor element 10 is mounted on a circuit substrate, one of the supply voltage and the ground voltage is applied to the electrode patterns 21A and 21B, and the other is applied to the electrode pattern 21C.

Figure 3B:
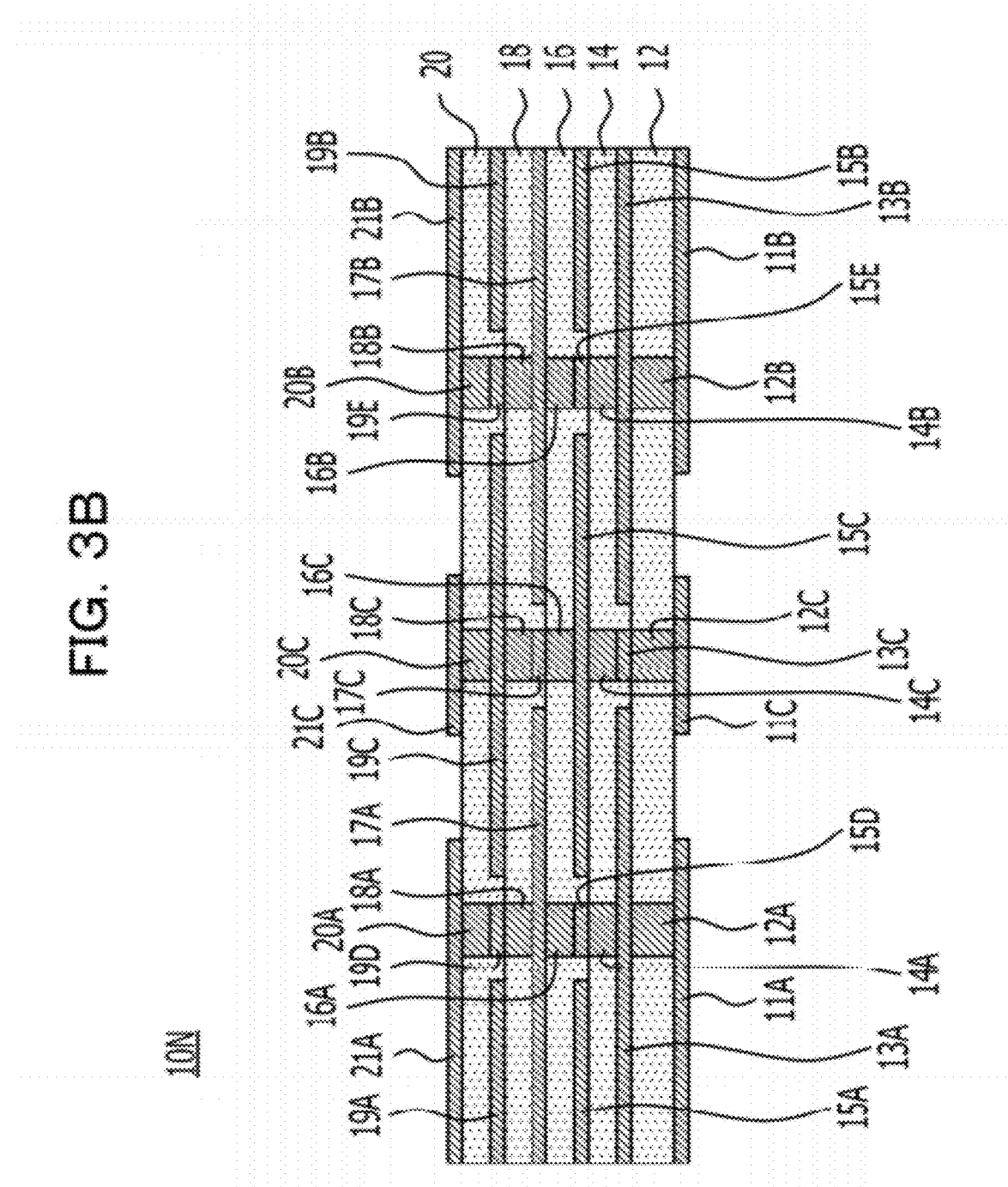

Alternatively, the base 11 may be removed as in the structure 10N of a modification shown in FIG. 3B after the capacitor 10 has been formed through the operations shown in FIGS. 2A to 2P. However, in the structure shown in FIG. 3B, the electrode patterns 11A and 11B are formed corresponding to the via-plugs 12A and 12B exposed at the surface of the dielectric film 12 by removal of the base 11, and also the via-plug 12C is formed corresponding to the via-plug 13C. Furthermore, the electrode pattern 11C is formed on the dielectric film 12, corresponding to the via-plug 12C.

In order to improve the state of the bonding interface, in the first embodiment, the dielectric film 12 may be provided with a layer made of a compound containing Li, Bi or Ge, such as LiF, $Pb_5Ge_3O_{11}$, $Bi_2O_3$ or $Li_2Bi_2O_5$, at a thickness of about 100 nm as a sintering agent layer on the surface thereof before the bonding operation shown in FIG. 2J. Such a sintering agent layer is preferably formed in the spaces between each of the electrode patterns 13A and 13B and the via-plug 13C, or between each of the electrode patterns 15A to 15C and each of the via-plugs 15D and 15E by aerosol deposition or sputtering, before the bonding operation shown in FIG. 2I or 2N. In this instance, it is preferable that the sintering agent deposited on the surfaces of the electrode patterns 13A and 13B and the via-plug 13C, or the electrode patterns 15A to 15C and the via-plugs 15D and 15E be removed by polishing or the like before the bonding operation.

In the first embodiment, the dielectric films 12, 14, 16, 18 and 20 each may be heat-treated every time aerosol deposition is performed as shown in FIG. 2A or 2D, and be bonded one by one by repeating SPS. Alternatively, the heat treatment may be performed by SPS when bonding is performed, instead of after the aerosol deposition. Many dielectric films heat-treated every their aerosol deposition may be stacked and then bonded at one time by SPS. Also, many films formed by aerosol deposition, but not heat-treated, may be prepared, and these films may be aligned and all the films are heat-treated by SPS so that the $BaTiO_3$ in each film can be sintered (or may be layered to form the structure of the complete capacitor element 10 and then heat-treated). In this instance, the heat treatment is performed only once, and thus the efficiency in manufacture is increased.

In the first embodiment, the above-described granular structure having an average grain size in the range of 5 nm to 500 nm is formed in the dielectric films 12, 14, 16, 18 and 20 by heat treatment. In this granular structure, unlike the columnar structure often observed in ceramic films formed by sputtering when the ceramic film is heat-treated, the grain boundaries do not continue in a ceramic film from one side to the other, and current paths for leakage current along the grain boundaries are interrupted. Consequently, a highly reliable capacitor element can be obtained.

The number of layers of the multilayer structure is not particularly limited in the first embodiment, and a structure including 100 or more layers is possible.

EXAMPLE 1

A capacitor element as shown in FIG. 1 was prepared by forming 20 to 50 $BaTiO_3$ dielectric layers corresponding to the dielectric films 12 to 20 on top of one another under the above-described conditions. As a result, it was confirmed that each dielectric film can be suitably and/or firmly bonded with the copper electrode patterns or via-plugs in contact therewith with no defect.

The relative dielectric constants of the dielectric films of the resulting capacitor element 10 were 1000 to 1500. The capacitance and the inductance of samples were also measured. The measured capacitances were as very high as 17 to 65 $\mu F/cm^2$, and the inductances were as very low as 3 pH. This low inductance is owing to the use of copper in the electrode patterns and via-plugs. In the capacitor element of Example 1, via-plugs of 50 μm in diameter were formed at a pitch of 150 μm.

The resulting capacitor element 10 was mounted within a multilayer circuit substrate 60, which will be described with reference to FIG. 6, by electroplating the via-plugs, but not using solder bumps. The impedance of the capacitor portion was measured at a frequency of 1 GHz, and the result was as very low as 0.1 mΩ. On the other hand, in a sample in which the same capacitor element was mounted in the same multilayer circuit substrate with solder bumps, the impedance was increased by 5 mΩ under the same conditions.

COMPARATIVE EXAMPLE 1

In Comparative Example 1, a capacitor element having the same structure as in Example 1 was prepared under the same conditions by hot press, instead of the pulsed electric current bonding as described with reference to FIG. 2J. However, in this instance, the dielectric films bonded together with copper electrode patterns or via-plugs therebetween were separated from each other, and thus, a stable capacitor element was not obtained.

COMPARATIVE EXAMPLE 2

In Comparative Example 2, a capacitor element having the same structure as in Example 1 was prepared under the same conditions by continuously applying a DC voltage, instead of performing the pulsed electric current bonding as described with reference to FIG. 2J. In Comparative Example 2 as well, the dielectric films bonded together with copper electrode patterns or via-plugs therebetween were separated from each other, and thus, a stable capacitor element was not obtained. This suggest that a current flows instantaneously along the grain boundaries in the dielectric films being bonded together at the pulse rise or fall during the pulsed electric current bonding described with reference to FIG. 2J, thereby bonding for example, the dielectric film 12 with the copper electrode patterns 13A and 13B or the dielectric film 12 with the via-plug 13C.

COMPARATIVE EXAMPLE 3

In Comparative Example 3, a capacitor element having the same structure as in Example 1 was prepared under the same conditions except that the dielectric films were formed by aerosol deposition using $BaTiO_3$ particles having an average particle size of 10 μm in the material container 163 shown in FIG. 4A. In Comparative Example 3, the dielectric films bonded together with copper electrode patterns or via-plugs therebetween were separated from each other, and thus, a stable capacitor element was not obtained.

The result of Comparative Example 3 shows that, in the first embodiment, it is preferable that the material used for the aerosol deposition have an average particle size of less than 10 μm.

COMPARATIVE EXAMPLE 4

A capacitor element having a different structure, including 20 $BaTiO_3$ dielectric layers that had been formed on top of one another by a green sheet method was prepared. In the structure, the via-plugs of 100 μm in diameter were disposed at a pitch of 350 μm. As a result, each dielectric film had a thickness of 5 μm, and a very high relative dielectric constant of 3000. However, the capacitance was as low as 10 $\mu F/cm^2$. The inductance of the entire capacitor element was 8 pH, and was thus considerably increased relative to that in Example 1. In Comparative Example 4, the electrode patterns were made of nickel, which is resistant to heat and has a high resistance.

COMPARATIVE EXAMPLE 5

$BaTiO_3$ dielectric films were formed by sputtering on a silicon substrate covered with a silicon oxide film, and thus a capacitor element having a different structure was prepared in which via-plugs having the same diameter as in Example 1 were disposed at the same pitch. In Comparative Example 5, the capacitor electrodes were made of platinum. In this capacitor element, since the dielectric films were formed by sputtering, the thickness of each dielectric film was not more than about 200 nm to 300 nm, and a crack occurred in some dielectric films by heat treatment for sintering (in the air or in an atmosphere of a gas containing oxygen). Accordingly, it was difficult to form a multilayer structure including many of these dielectric films, and the number of dielectric films was not more than three. The capacitance of the thus prepared capacitor was about 3.5 $\mu F/cm^2$ to 4.5 $\mu F/cm^2$, and the relative dielectric constant of the dielectric films was not more than about 200 to 300. Also, the inductance of the capacitor was increased to 10 pH.

In Example 1, the pulsed electric current bonding described with reference to FIG. 2J was experimented using molybdenum or tungsten jigs as the jigs 51 and 52. The resulting $BaTiO_3$ films 13 and 14 exhibited very high insulating resistances of $10^{12}$ Ωcm. In Example 1, since dielectric films having such a very high insulation resistance were used in the capacitor element 10 shown in FIG. 1, leakage current in the capacitor element can be reduced effectively.

On the other hand, the pulsed electric current bonding described with reference to FIG. 2J was experimented using graphite jigs as the jigs 51 and 52. The resulting BaTiO$_3$ films 13 and 14 exhibited low insulating resistances of $10^9$ Ωcm. This is probably because the graphite jigs consumed a trace amount of oxygen in the atmospheric gas to extremely reduce the oxygen partial pressure while the pulsed electric current bonding was performed in an inert gas atmosphere. Consequently, the oxygen atom in the dielectric film was removed through the atmospheric gas to produce a dielectric film having a non-stoichiometric composition expressed by the general formula BaTiO$_{3-x}$.

Therefore, in the first embodiment, it is preferable that the pulsed electric current bonding shown in FIG. 2J be performed using jigs containing molybdenum and tungsten as the jigs 51 and 52, but not denying the use of graphite jigs.

Second Embodiment

FIGS. 5A to 5H are representations of a method of manufacturing the capacitor element 10 shown in FIG. 1, according to a second embodiment.

Figure 5A:
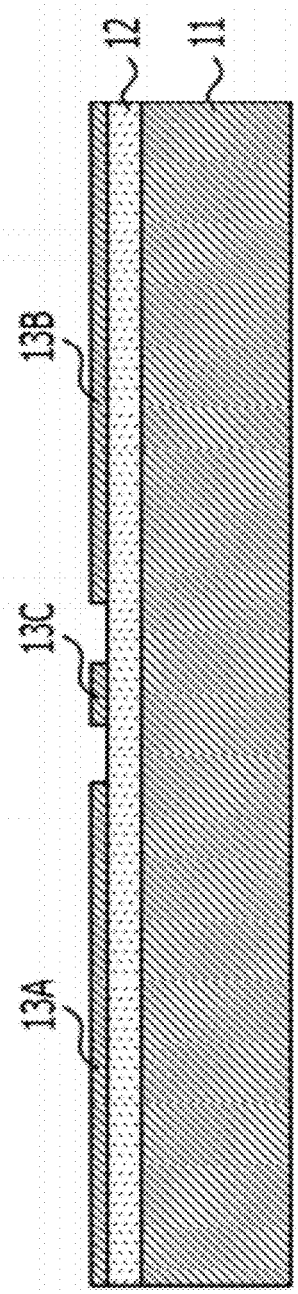

Referring to FIG. 5A, in the second embodiment, a BaTiO$_3$ dielectric film 12 is formed on a base 11 in the same manner as in the first embodiment, and copper electrode patterns 13A and 13B and a via-plug 13C are formed on the dielectric film 12. However, in the second embodiment, via-plugs 12A and 12B are not formed in the dielectric film 12.

A BaTiO$_3$ dielectric film 14 is formed on the base 41 in the same manner as in the case of the first embodiment at the same time as, or before or after the operation shown in FIG. 5A. However, in the second embodiment, via-plugs 14A to 14C are not formed in the dielectric film 14 in the state shown in FIG. 5B.

Figure 5B:
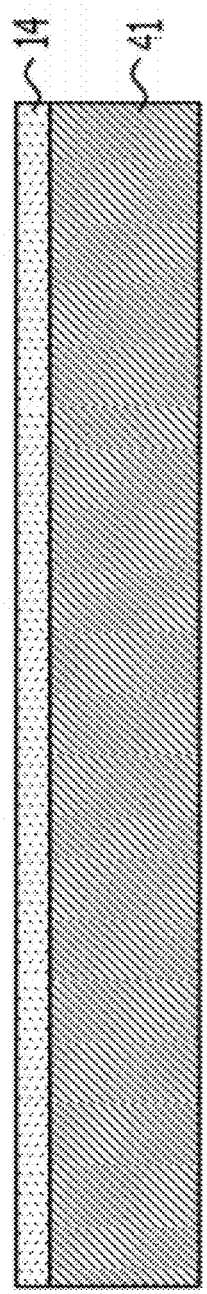

The structure shown in FIG. 5B is turned upside down as shown in FIG. 5C, and is disposed in such a manner that the dielectric film 14 opposes the electrode patterns 13A and 13B and the via-plug 13C on the dielectric film 12. Then, pulsed electric current bonding is performed as in the operation shown in FIG. 2J while the bases 11 and 14 are being pressed on each other with jigs 51 and 52, as shown in FIG. 5D. Thus the structure shown in FIG. 5E is prepared.

After the base 41 is removed as shown in FIG. 5F, via-holes 14$a$ to 14$c$ are formed in the dielectric film 14 corresponding to the electrode patterns 13A and 13B and the via-plug 13C, respectively, and copper via-plugs 14A to 14C are formed in the via-holes 14$a$ to 14$c$, respectively, as shown in FIG. 5G.

Figure 5H:
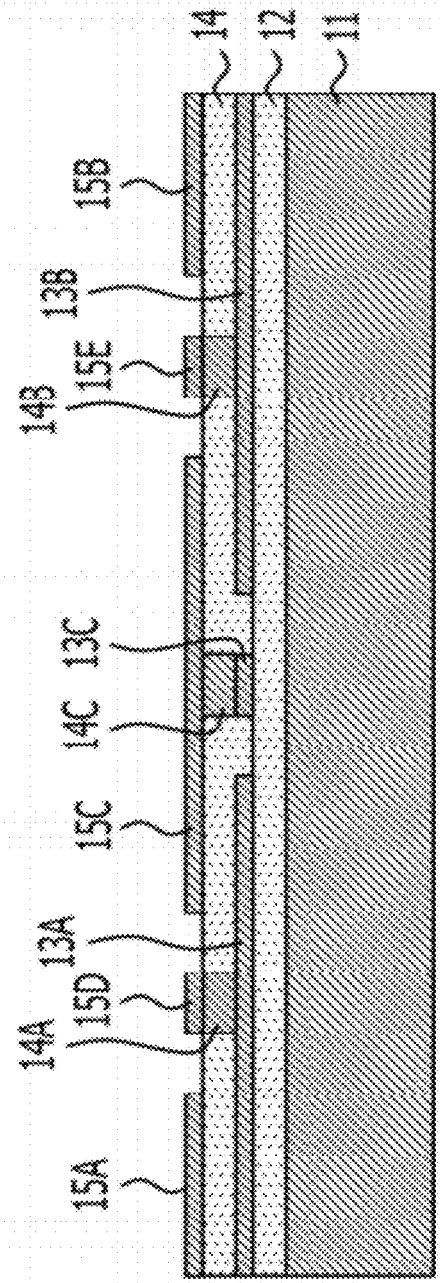

Further, as shown in FIG. 5H, electrode patterns 15A to 15C and via-plugs 15D and 15E are formed on the dielectric film 14 to form the same structure as the structure shown in FIG. 2M.

In the second embodiment, when the pulsed electric current bonding shown in FIG. 5D is performed, conductor patterns passing through the structure between the bases 11 and 41 are not present. Accordingly, current does not concentrate to a specific current path, and power consumption can be reduced.

Third Embodiment

Figure 6:
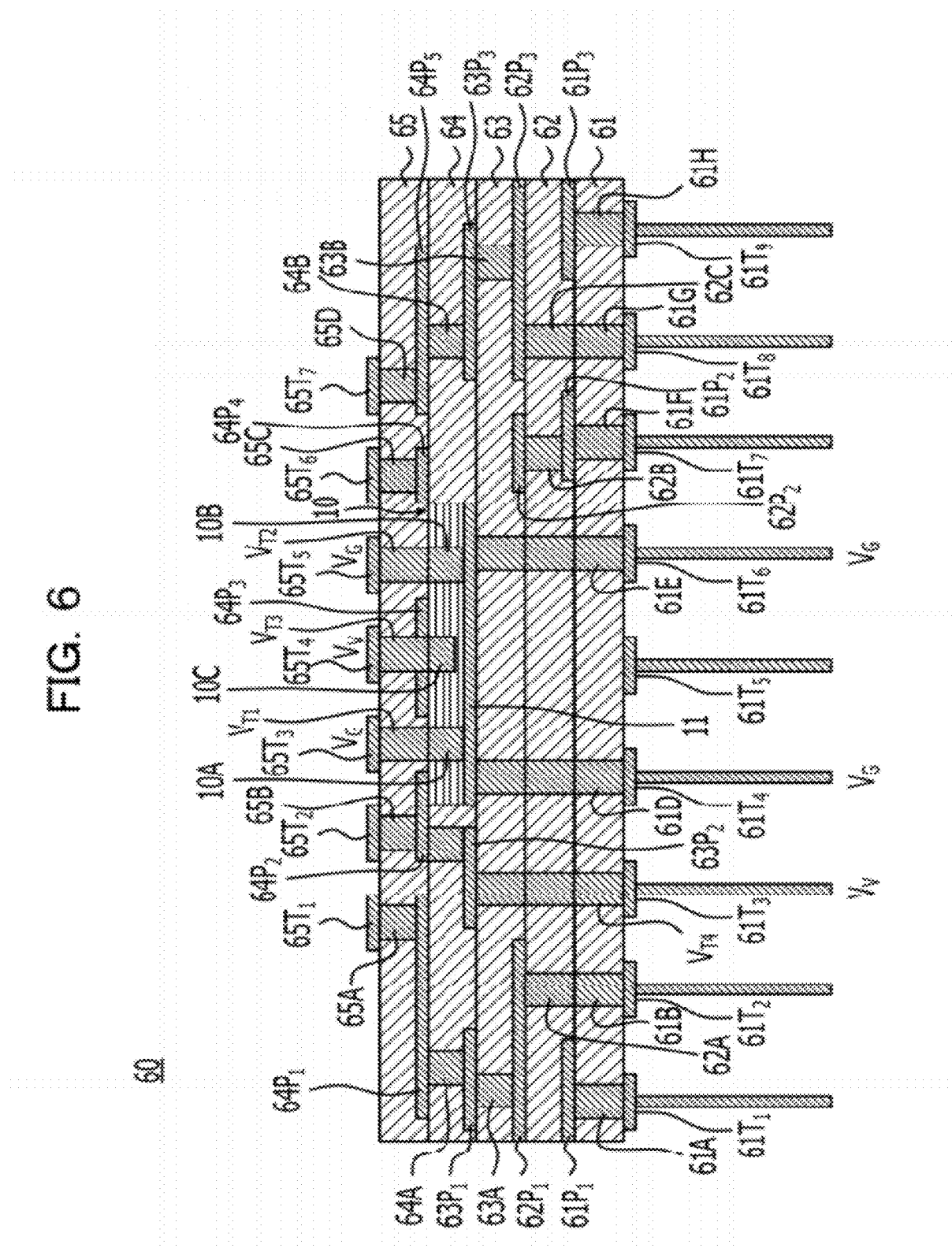
FIG. 6 is a sectional view of a circuit substrate according to a third embodiment.
Figure 7:
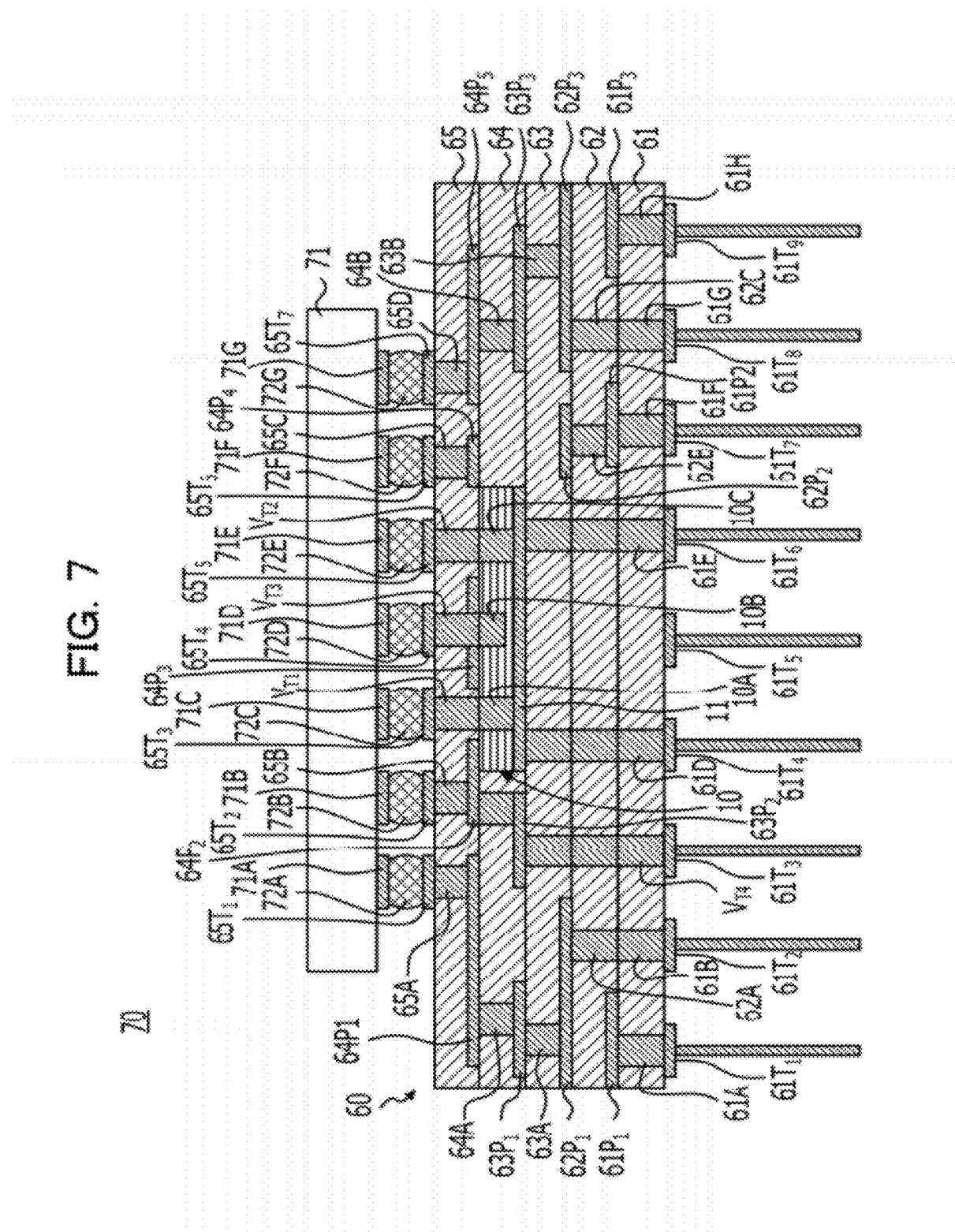
FIG. 7 is a sectional view of a semiconductor apparatus according to a fourth embodiment.

FIG. 6 is a sectional view of a multilayer circuit substrate 60 in which the capacitor element 10 of the first embodiment is mounted in a resin multilayer structure including build-up layers 61 to 65. FIG. 7 is a sectional view of a semiconductor apparatus 70 including a semiconductor chip 71 that has been mounted on the multilayer circuit substrate 60 by flip-chip bonding.

In FIG. 6, many copper electrode pads 65T$_1$ to 65T$_7$ for connection with a semiconductor chip 71 are formed on the uppermost surface of the multilayer circuit substrate 60, and external terminals 61T$_1$ to 61T$_9$ for connection with a wiring substrate are formed at the bottom or rear side of the multilayer circuit substrate 60.

Each of the build-up layers 61 to 65 is typically made of an epoxy film containing silica particles or an epoxy resin film reinforced with glass cloth, and has a thickness of, for example, about 20 μm. Also, the build-up layers have a wiring structure through which the electrode pads 65T$_1$, 65T$_2$, 65T$_6$ and 65T$_7$ are electrically connected to the corresponding external connection terminals 61T$_1$ and 61T$_2$ and 61T$_7$ to 61T$_9$. For example, the wiring structure may include the copper via-plugs 61A and 61B and 61F to 61H formed in the build-up layer 61, the copper via-plugs 62A to 62C formed in the build-up layer 62, the copper via-plugs 63A and 63B formed in the build-up layer 63, the copper via-plugs 64A and 64B formed in the build-up layer 64, the copper via-plugs 65A, 65C and 65D formed in the build-up layer 65, the copper wiring patterns 61P$_1$ to 61P$_3$ formed on the build-up layer 61 and covered with the build-up layer 62, the copper wiring patterns 62P$_1$ to 62P$_3$ formed on the build-up layer 62 and covered with the build-up layer 63, the wiring patterns 63P$_1$ to 63P$_3$ formed on the build-up layer 63 and covered with the build-up layer 64, and the copper wiring patterns 64P$_1$ to 64P$_5$ formed on the build-up layer 64 covered with the build-up layer 65.

For example, the external terminal 61T$_2$ is electrically connected to the electrode terminal 65T$_1$ through the via-plugs 61B and 62A, the wiring pattern 62P$_1$, the via-plug 63A, the wiring pattern 63P$_1$, the via-plug 64A, the wiring pattern 64P$_1$, and the via-plug 65A. Also, the external terminal 61T$_8$ is electrically connected to the electrode terminal 65T$_7$ through the via-plugs 61C and 62C, the wiring pattern 62P$_3$, the via-plug 63B, the wiring pattern 63P$_3$, the via-plug 64B, the wiring pattern 64P$_5$, and the via-plug 65D.

In FIG. 6, the via-plug 10A in the capacitor element 10 represents a current path defined by the via-plugs 12A, 14A, 15D, 16A, 18A, 19D and 20A, and is connected to the electrode pad 65T$_3$ through a through-via plug V$_{T1}$ passing through the build-up layer 65. The via-plug 10B in the capacitor element 10 represents a current path defined by the via-plugs 12B, 14B, 15E, 16B, 18B, 19E and 20B, and is connected to the electrode pad 65T$_5$ through a through-via plug V$_{T2}$ passing through the build-up layer 65. Thus, the electrode pads 65T$_3$ and 65T$_5$ have a ground voltage V$_G$ from which noise has been removed by the capacitor element 10.

Also, the via-plug 10C in the capacitor element 10 represents a current path defined by the via-plugs 13C, 14C, 16C, 17C, 18C and 20C, and is connected to the electrode pad 65T$_4$ through the through-via plug V$_{T3}$ passing through the build-up layer 65.

In the multilayer circuit substrate 60, the external connection terminal 61T$_3$ is a power supply terminal to which the supply voltage V$_V$ is applied, and to which the via-plug V$_{T4}$ passing through the build-up layers 61 to 65 is connected. The via-plug V$_{T4}$ is electrically connected to the wiring pattern 63P$_2$ formed on the build-up layer 63 and covered with the build-up layer 64. The wiring pattern 63P$_2$ extends along the surface of the build-up layer 63 to be electrically connected to the through-via plug 65T$_4$. Thus, the electrode pad 65T$_4$ has a supply voltage V$_V$ from which noise has been removed by the capacitor element 10.

Fourth Embodiment

As shown in FIG. 7, a semiconductor chip 71 having electrode pads 71A to 71G is mounted on the uppermost surface of the multilayer circuit substrate 60 by flip chip bonding in such a manner that the electrode pads 71A to 71G come in contact with the corresponding electrode pads 65T$_1$ to 65T$_7$ with solder bumps 72A to 72G, respectively. Thus, a semiconductor apparatus 70 is produced in which a ground and a supply voltage $V_G$ and $V_V$ from which noise has been removed effectively can be applied to the semiconductor chip 71.

The via-plugs 61A, 61B, 61D to 61H, 62A to 62C, 63A, 63B, 64A, 64B, 65A to 65D and the like can be formed by, for example, electroplating, and the wiring patterns $61P_1$ to $61P_3$, $62P_1$ to $62P_3$, $63P_1$ and $63P_3$, $64P_1$ to $64P_4$ and the like can be formed by, for example, sputtering.

The external connection terminals $61T_4$ and $61T_6$ of the multilayer circuit substrate 60, which are power-supply terminals to which a ground voltage $V_G$ is to be applied, are electrically connected to the base 11 of the capacitor element 10 with the respective via-plugs 61D and 61E.

Figure 8A:
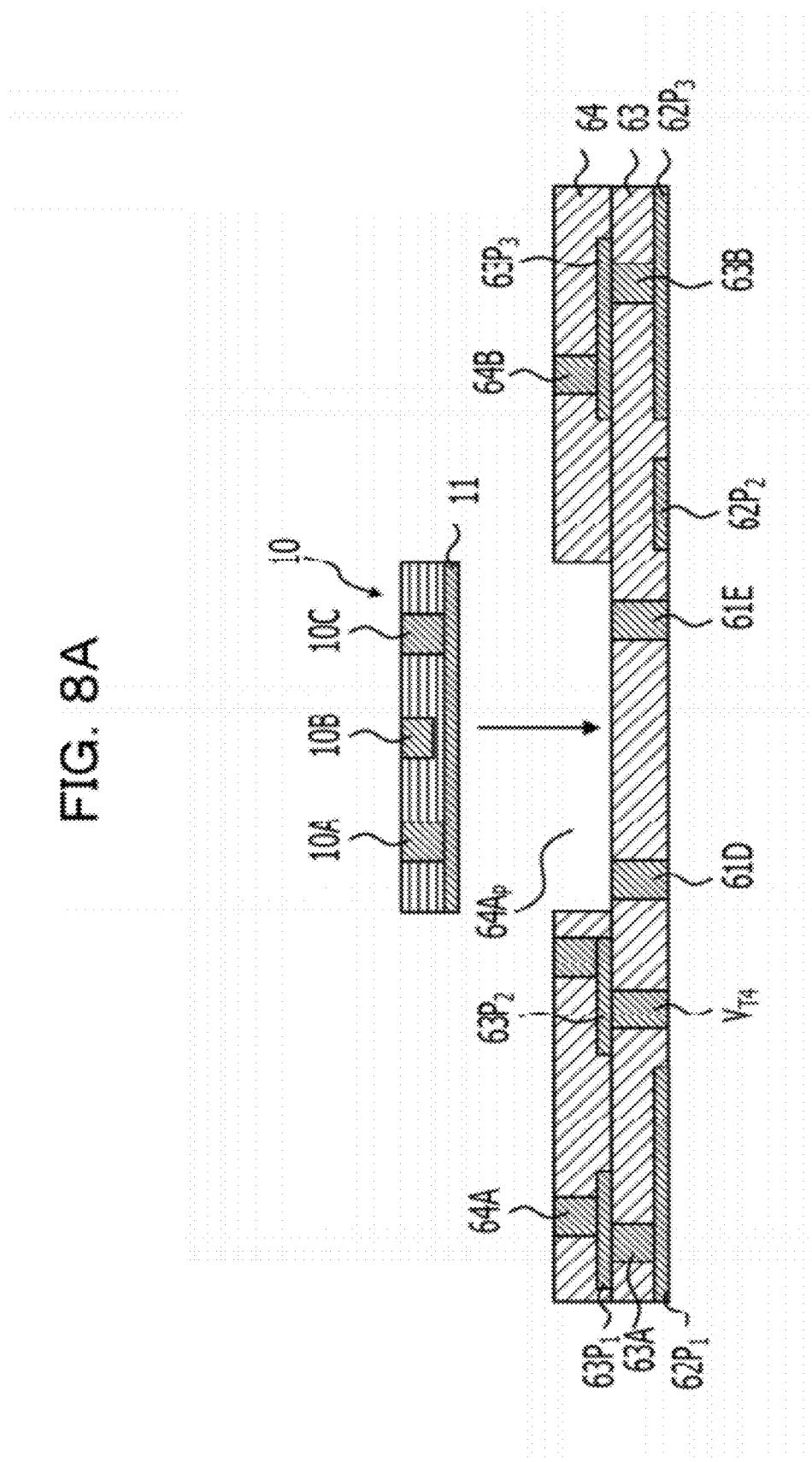
FIGS. 8A and 8B are representations of a method of manufacturing the circuit substrate shown in FIG. 6.
Figure 8B:
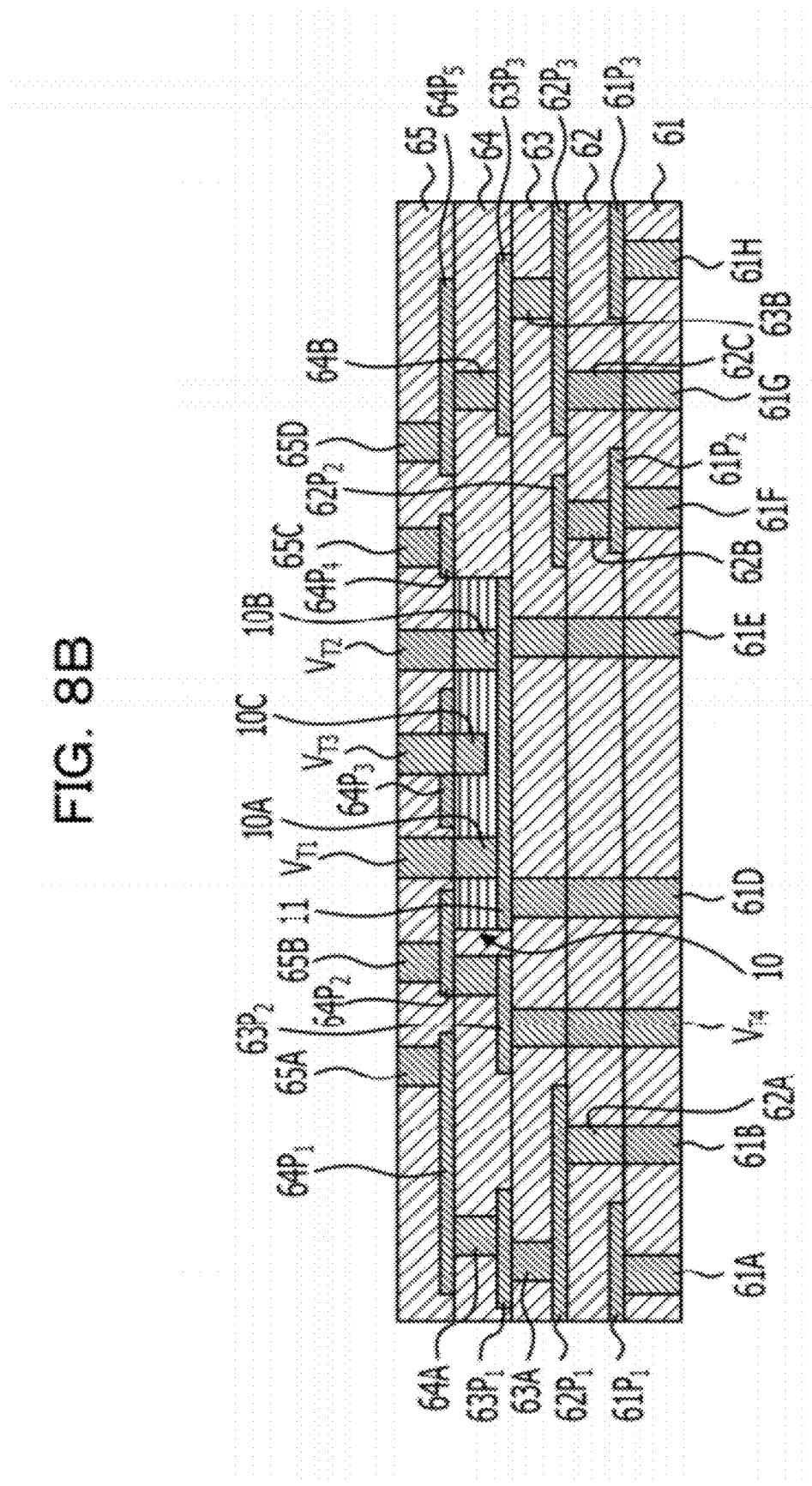

FIGS. 8A and 8B are sectional views illustrating a method of manufacturing the multilayer circuit substrate 60 shown in FIG. 6, particularly illustrating the operation for mounting the capacitor element 10.

Referring to FIG. 8A, the wiring patterns $63P_1$, $63P_2$ and $63P_3$ are formed on the build-up layer 63, and the build-up layer 64 is formed on the build-up layer 63 so as to cover the wiring patterns $63P_1$, $63P_2$ and $63P_3$. In FIG. 8A, the portion under the build-up layer 63 is omitted.

The build-up layer 64 has an opening 64Ap corresponding to the capacitor element 10, and the capacitor element 10 is mounted on the build-up layer 63 in the opening 64Ap as indicated by the arrow, and is bonded with an adhesive layer (not shown). Alternatively, the capacitor element 10 may be bonded to the surface of the build-up layer 63 in advance, and then the build-up layer 64 is formed on the build-up layer 63.

Subsequently, the build-up layer 65 is formed on the build-up layer 64 together with wiring patterns and via-plugs to form the structure shown in FIG. 8B.

In the multilayer circuit substrate 60, the through-via plugs $V_{T1}$, $V_{T2}$, $V_{T3}$ and $V_{T4}$ can be connected to the capacitor element 10 embedded in the build-up layer 62 by electroplating without using solder bumps. Accordingly, the occurrence of the parasitic resistance in the multilayer circuit substrate 60 can be suppressed to reduce the parasitic impedance.

Figure 9:
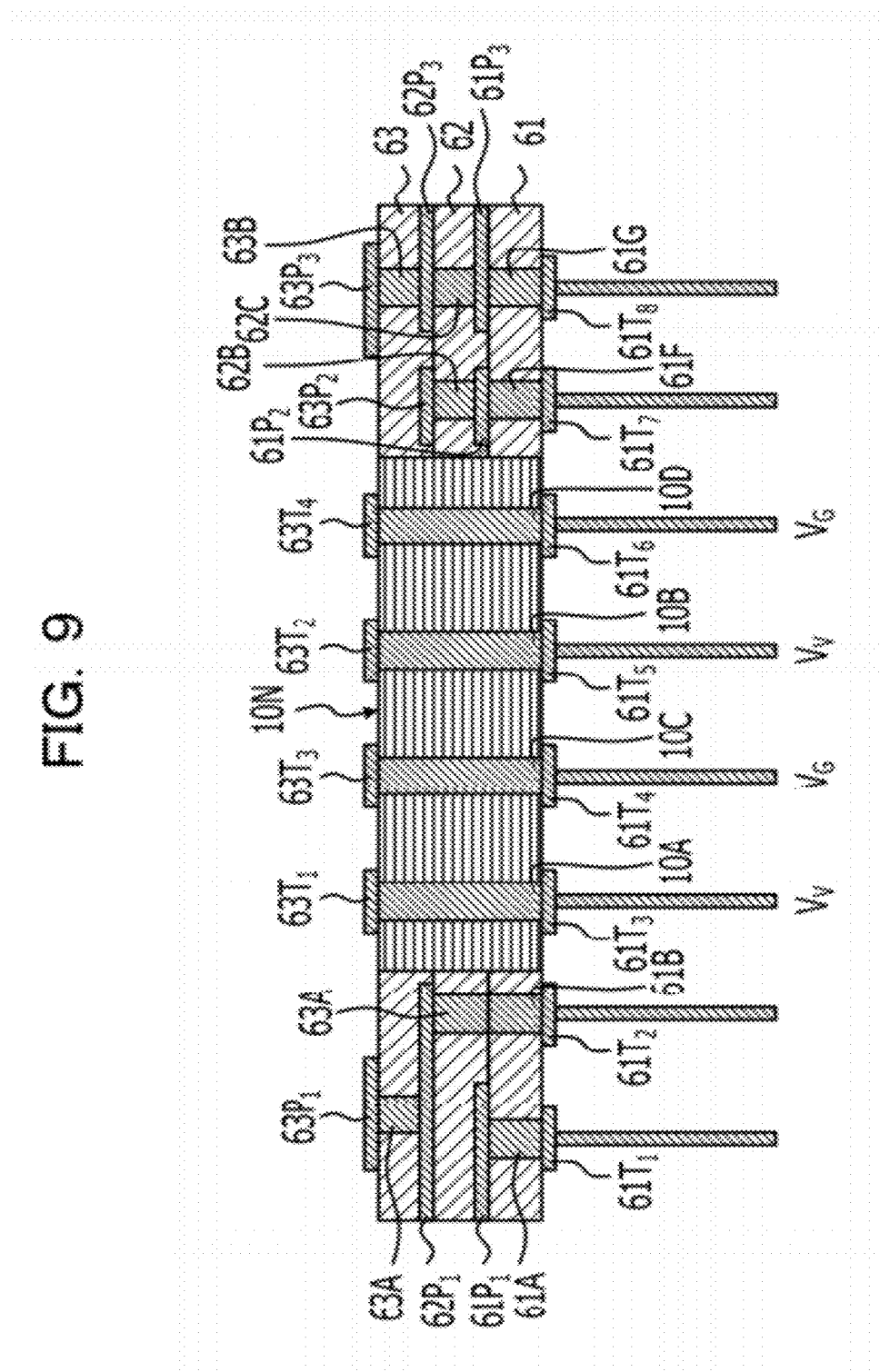
FIG. 9 is a sectional view of a modification of the circuit substrate shown FIG. 6.

FIG. 9 is a sectional view of a modification of the circuit substrate shown FIG. 6. The same parts as described with reference to FIG. 6 are designated by the same reference numerals, and thus description thereof is omitted.

The circuit substrate shown in FIG. 9 includes a stack of build-up layers 61 to 63, and in which the capacitor element 10N of the modification described with reference to FIG. 3B is mounted.

The capacitor element 10N used in the structure shown in FIG. 9 is produced by repeatedly forming many dielectric films and electrode patterns and via-plugs one on top of another, so that the thickness of the capacitor element 10N can be substantially the same as the total thickness of the circuit substrate. Also, in addition to the via-plugs 10A to 10C, a via-plug 10D similar to the via-plug 10C is provided adjacent to the via-plug 10B. Furthermore, electrode pads $63T_1$ to $63T_4$ are formed corresponding to the via-plugs 10A to 10D.

When such a circuit substrate is used in the same semiconductor apparatus as the circuit substrate shown in FIG. 7, the noise of the power supply system transmitted to the semiconductor chip 71 can be blocked effectively.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A capacitor, comprising:
    a metal base;
    a plurality of capacitor dielectric layers made of a ceramic and disposed on top of one another on the base, the capacitor dielectric layers including:
        a first capacitor dielectric layer,
        a second capacitor dielectric layer adjacent to the first capacitor dielectric layer, and
        a third capacitor dielectric layer adjacent to the second capacitor dielectric layer at the opposite side to the first capacitor dielectric layer;
    a first copper electrode pattern and a first copper via-plug with a space therebetween between the first capacitor dielectric layer and the second capacitor dielectric layer;
    a second copper electrode pattern and a fourth copper via-plug with a space therebetween between the second capacitor dielectric layer and the third capacitor dielectric layer; and
    a second via-plug and a third via-plug in the second capacitor dielectric layer,
    wherein
        the first copper electrode pattern opposes the second copper electrode pattern with the second capacitor dielectric layer therebetween,
        the first copper via-plug is electrically connected to the second copper electrode pattern through the third via-plug,
        the fourth copper via-plug is electrically connected to the first copper electrode pattern through the second via-plug, and
        the first copper electrode pattern and the second copper electrode pattern are electrically connected to a first terminal and a second terminal, respectively.

2. The capacitor according to claim 1, wherein each of the capacitor dielectric layers has a granular structure having an average grain size in the range of 5 nm to 500 nm.

3. The capacitor according to claim 1, wherein the spaces between the first electrode pattern and the first via-plug, and between the second electrode pattern and the fourth via-plug are filled with the ceramic.

4. The capacitor according to claim 1, wherein the ceramic contains a material having a base composition selected from the group consisting of $BaTiO_3$, $SrBaTiO_3$, $PbTiZrO_3$, $(Ba,Sr)TiO_3$, $Ba(Zr,Ti)O_3$, $KNbO_3$, $K_{0.5}Na_{0.5}NbO_3$, $KNbO_3 \cdot NaNbO_3 \cdot LiNbO_3$, $(Bi_{1/2}K_{1/2})TiO_3$, $(Bi_{1/2}Na_{1/2})TiO_3$, $BiFeO_3$, $(Sr,Ca)_2NaNb_5O_{15}$, $(Sr,Ba)NbO_6$, $Ba_2(Na,K)Nb_5O_{15}$, $Bi_4Ti_3O_{12}$, $SrBiTiTaO_3$, $SiBi_2Ta_2O_9$, $SrBi_2Nb_2O_9$, $(Sr,Ca)_2Bi_4Ti_5O_{18}$, $CaBi_4Ti_4O_{15}$, $LiNbO_3$, $LiTaO_3$, and $PbNb_2O_6$.

5. The capacitor according to claim 1, wherein each capacitor dielectric layer has a thickness in the range of 0.3 µm to 5 µm.

6. The capacitor according to claim 1, wherein the capacitor has a thickness of 80 µm or less.

7. A circuit substrate, comprising:
    a multilayer structure including a plurality of resin build-up layers, a plurality of external terminals including a power supply terminal and a ground terminal on a first side thereof, and a plurality of electrode pads including a power supply pad and a ground pad on a second side opposite to the first side; and a capacitor embedded in one of the resin build-up layers, the capacitor including:

a metal base;

a plurality of ceramic capacitor dielectric layers disposed on top of one another on the base, the capacitor dielectric layers including a first capacitor dielectric layer, a second capacitor dielectric layer adjacent to the first capacitor dielectric layer, and a third capacitor dielectric layer adjacent to the second capacitor dielectric layer at the opposite side to the first capacitor dielectric layer;

a first copper electrode pattern and a first copper via-plug with a space therebetween between the first capacitor dielectric layer and the second capacitor dielectric layer;

a second copper electrode pattern and a fourth copper via-plug with a space therebetween between the second capacitor dielectric layer and the third capacitor dielectric layer; and a second via-plug and a third via-plug in the second capacitor dielectric layer, wherein
the first copper electrode pattern opposes the second copper electrode pattern with the second capacitor dielectric layer therebetween,
the first copper via-plug is electrically connected to the second copper electrode pattern through the third via-plug,
the fourth copper via-plug is electrically connected to the first copper electrode pattern through the second via-plug, and
the first copper electrode pattern and the second copper electrode pattern are electrically connected to a first terminal and a second terminal, respectively.

8. A semiconductor apparatus, comprising:
a circuit substrate including a multilayer structure of a plurality of resin build-up layers, having external terminals including a power supply terminal and a ground terminal on a first side thereof, and a plurality of electrode pads including a power supply pad and a ground pad on a second side opposite to the first side;

a semiconductor chip having a plurality of electrodes, mounted on the circuit substrate by flip chip bonding in such a manner that the electrodes are connected to the corresponding electrode pads; and a capacitor embedded in one of the resin build-up layers, the capacitor including:

a metal base;

a plurality of ceramic capacitor dielectric layers disposed on top of one another on the base, the capacitor dielectric layers including a first capacitor dielectric layer, a second capacitor dielectric layer adjacent to the first capacitor dielectric layer, and a third capacitor dielectric layer adjacent to the second capacitor dielectric layer at the opposite side to the first capacitor dielectric layer;

a first copper electrode pattern and a first copper via-plug with a space therebetween between the first capacitor dielectric layer and the second capacitor dielectric layer;

a second copper electrode pattern and a fourth copper via-plug with a space therebetween between the second capacitor dielectric layer and the third capacitor dielectric layer; and a second via-plug and a third via-plug in the second capacitor dielectric layer, wherein
the first copper electrode pattern opposes the second copper electrode pattern with the second capacitor dielectric layer therebetween,
the first copper via-plug is electrically connected to the second copper electrode pattern through the third via-plug,
the fourth copper via-plug is electrically connected to the first copper electrode pattern through the second via-plug, and
the first copper electrode pattern and the second copper electrode pattern are electrically connected to a first terminal and a second terminal, respectively.

* * * * *